(12) United States Patent
Byun et al.

(10) Patent No.: US 8,189,167 B2
(45) Date of Patent: May 29, 2012

(54) MASK HOLDER FOR IRRADIATING UV-RAYS

(75) Inventors: Yong Sang Byun, Kyongsangbuk-do (KR); Moo Yeol Park, Taegu-kwangyokshi (KR); Sung Su Jung, Taegu-kwangyokshi (KR)

(73) Assignee: LG Display Co., Ltd., Seoul (KR)

( * ) Notice: Subject to any disclaimer, the term of this patent is extended or adjusted under 35 U.S.C. 154(b) by 885 days.

(21) Appl. No.: 11/318,444

(22) Filed: Dec. 28, 2005

(65) Prior Publication Data

US 2006/0098185 A1 May 11, 2006

Related U.S. Application Data

(63) Continuation of application No. 10/245,498, filed on Sep. 18, 2002, now Pat. No. 7,006,202.

(30) Foreign Application Priority Data

| Feb. 21, 2002 | (KR) | 10-2002-009338 |
| Feb. 22, 2002 | (KR) | 10-2002-009612 |
| Feb. 22, 2002 | (KR) | 10-2002-009613 |

(51) Int. Cl.
*G02F 1/1339* (2006.01)
*G02F 1/13* (2006.01)

(52) U.S. Cl. .......... 349/190; 349/153; 349/187

(58) Field of Classification Search .......... 349/187–192, 349/58–60, 153–154; 355/72–76, 52; 206/557; 422/102

See application file for complete search history.

(56) References Cited

U.S. PATENT DOCUMENTS

| 4,746,548 A * | 5/1988 | Boudreau et al. .......... 427/248.1 |
| 4,807,963 A * | 2/1989 | Iwasaki .................... 385/115 |
| 5,557,436 A * | 9/1996 | Blose et al. ................ 349/153 |
| 5,677,749 A * | 10/1997 | Tsubota et al. ............ 349/160 |
| 5,847,813 A * | 12/1998 | Hirayanagi ................ 355/75 |
| 5,937,272 A | 8/1999 | Tang |
| 6,280,646 B1 | 8/2001 | Stocks et al. |
| 6,338,924 B1 | 1/2002 | Tsuruma et al. |
| 6,665,043 B1 * | 12/2003 | Okuyama et al. .......... 349/187 |
| 6,762,807 B2 * | 7/2004 | Lee et al. .................. 349/58 |
| 2003/0179354 A1* | 9/2003 | Araki et al. ................ 355/53 |

FOREIGN PATENT DOCUMENTS

| JP | H03-060307 | | 3/1991 |
| JP | H09-073096 | | 3/1997 |
| JP | 10050584 A | * | 2/1998 |
| JP | H10-050584 | | 2/1998 |
| JP | H10-242033 | | 9/1998 |
| JP | 11-160856 | * | 6/1999 |
| JP | H11-160856 | | 6/1999 |
| JP | 2000150344 A | * | 5/2000 |

* cited by examiner

*Primary Examiner* — Jessica M Merlin
(74) *Attorney, Agent, or Firm* — McKenna Long & Aldridge, LLP

(57) ABSTRACT

A mask holder for irradiating UV-rays is disclosed in the present invention. The mask holder includes a lower part having a frame and a mask supporting member supporting a mask, wherein the mask supporting member is in the frame and has a plurality of first connecting portions, and an upper part having a plurality of second connecting portions to be aligned with the first connecting portions.

6 Claims, 24 Drawing Sheets

MASK HOLDER FOR IRRADIATING UV-RAYS

This application is a Continuation of prior application Ser. No. 10/245,498, filed Sep. 18, 2002 now U.S. Pat. No. 7,006, 202.

This application claims the benefit of the Korean Application Nos. P2002-009338 filed on Feb. 21, 2002, P2002-009612 filed on Feb. 22, 2002, and P2002-009613 filed on Feb. 22, 2002, which are hereby incorporated by reference.

BACKGROUND OF THE INVENTION

1. Field of the Invention

The present invention relates to an apparatus for fabricating a liquid crystal display device, and more particularly, to a mask holder for irradiating UV-rays.

2. Discussion of the Related Art

A thin flat panel display tends to have a thickness of no more than a few centimeters and is operated at a low voltage. Such displays consume less power and are portable. Among them, a liquid crystal display device has been the most widely used in various fields such as a notebook computer, a computer monitor, a gauge monitor for spacecrafts and airplanes, and the like.

Such a liquid crystal display device, as shown in FIG. 1, generally includes a lower substrate 1 having a plurality of thin film transistors (not shown) and pixel electrodes 3 formed thereon, an upper substrate 2 having a black matrix layer 4, a color filter layer 6, and a common electrode 8, and a liquid crystal layer 5 between the lower and upper substrates 1 and 2. Electric fields are generated between the pixel and common electrodes 3 and 8 so as to drive the liquid crystal layer 5. Light transmittance is controlled through the driven liquid crystal layer 5 in order to display images on the display screen.

Moreover, alignment layers (not shown) are formed on the front sides of the substrates 1 and 2 for an initial alignment of the liquid crystals 5.

A sealant 10 is formed between the lower and upper substrates 1 and 2 so as to prevent liquid crystals from leaking out of the substrates and to bond the substrates to each other.

The sealant 10 is coated on the lower or upper substrate 1 or 2, and is then hardened after attaching the lower and upper substrates 1 and 2 to each other. Types of such sealants include a thermo-hardening sealant and a UV-hardening sealant, which are hardened by heat and UV-rays, respectively.

Meanwhile, the type of sealant may be selected from one of the thermo-hardening sealant and the UV-hardening sealant depending on the method of fabricating a liquid crystal display device.

In a vacuum injection method for injecting liquid crystals in the attached substrates using a capillary phenomenon and a pressure difference, the sealant is hardened before the liquid crystals are injected after attaching the lower and upper substrates to each other. There is no chance of contaminating the liquid crystals even if the sealant leaks out. Hence, the vacuum injection method mainly uses the thermo-hardening sealant.

In the liquid crystal dropping method, the attaching process of two substrates is carried out after dispensing the liquid crystals on one of the substrates 1 and 2. The sealant is hardened after forming the liquid crystal layer. Hence, when the thermo-hardening sealant is used, the sealant flows out during a heating process, thereby contaminating the liquid crystals. Therefore, the UV hardening sealant is mainly used for an LCD formed by the liquid crystal dropping method.

FIG. 2 is a perspective view illustrating a UV emitting device for hardening a UV-hardening sealant in a liquid crystal display device using the liquid crystal dropping method of the related art.

Referring to FIG. 2, a UV emitting device of the related art includes a substrate stage 20 and a UV source unit 30 having a UV lamp 32 placed over the substrate stage 20.

A hardening process of a sealant using such a UV emitting device of the related art is carried out in a manner that UV-rays are irradiated by the UV source unit 30 to attached substrates 1 and 2 loaded on the substrate stage 20 of the UV emitting device. In this case, a UV-hardening sealant 10 is formed inside the attached substrates 1 and 2.

In the UV emitting device of the related art, the UV-rays from the UV source unit 30 are irradiated to the entire surface of the substrate stage 20 on which the attached substrates are loaded. Thus, the UV-rays are irradiated onto the entire exposed surface of the attached substrates.

However, once the UV-rays are irradiated to the entire surface of the attached substrates, characteristics of devices on the substrate, such as thin film transistors and the like, are degraded. Moreover, a pre-tilt angle of the alignment layer for an initial alignment of the liquid crystals is changed.

SUMMARY OF THE INVENTION

Accordingly, the present invention is directed to a mask holder for irradiating UV-rays that substantially obviates one or more of problems due to limitations and disadvantages of the related art.

Another object of the present invention is to provide a mask holder for irradiating UV-rays, which includes a mask for selectively irradiating UV-rays only on a sealant-formed area, so as to harden a UV-hardening sealant without degrading characteristics of devices on the substrates, such as alignment layers, thin film transistors, and the like.

Another object of the present invention is to provide a mask holder for irradiating UV-rays effectively securing a mask.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a mask holder for irradiating UV-rays includes a lower part having a frame and a mask supporting member supporting a mask, wherein the mask supporting member is in the frame and has a plurality of first connecting portions, and an upper part having a plurality of second connecting portions to be aligned with the first connecting portions.

In another aspect of the present invention, a UV emitting device includes a substrate stage, a UV source unit, a mask between the substrate stage and the UV source unit, and a mask holder including a lower part having a frame and a mask supporting member supporting a mask, wherein the mask supporting member is in the frame and has a plurality of first connecting portions, and an upper part having a plurality of second connecting portions to be aligned with the first connecting portions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1:
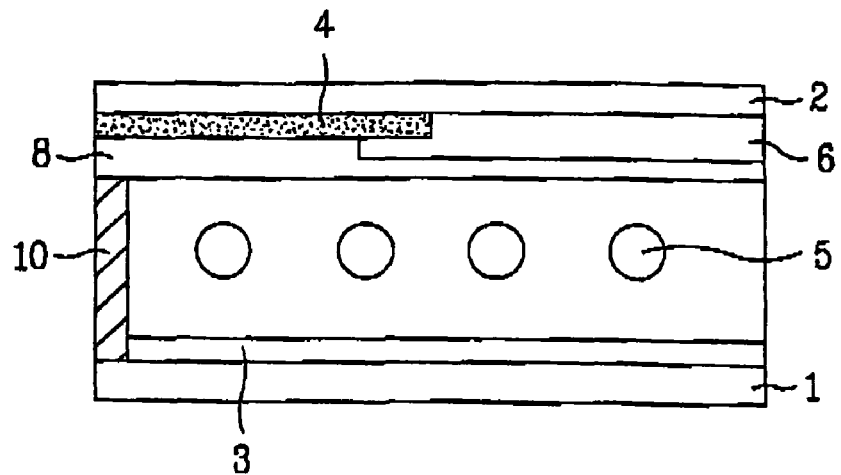
FIG. 1 illustrates a schematic cross-sectional view of a related art liquid crystal display device.
Figure 2:
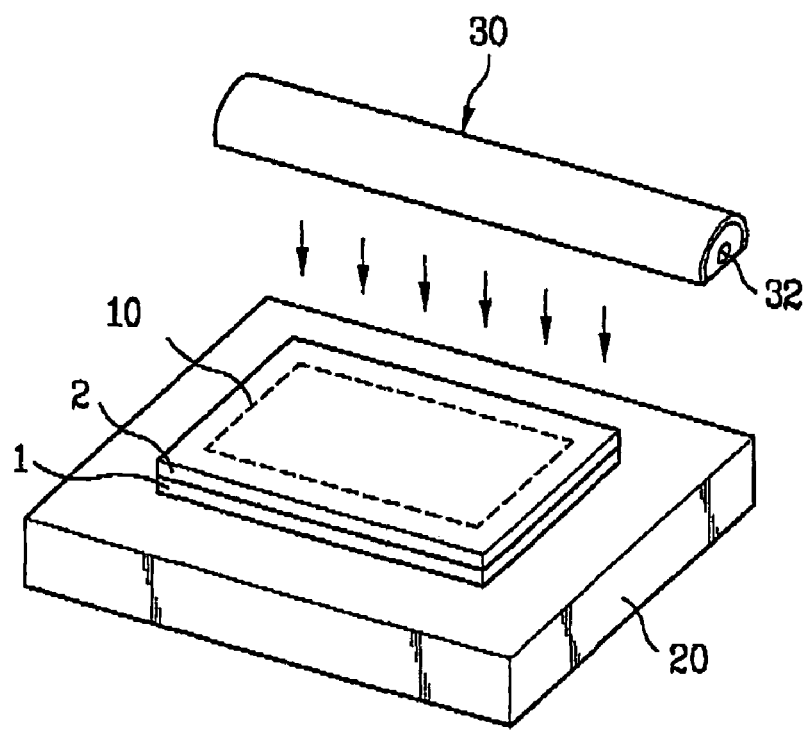
FIG. 2 is a schematic perspective view illustrating a UV emitting device for hardening a UV-hardening sealant in a liquid crystal display device using a related art liquid crystal dropping method.
Figure 3:
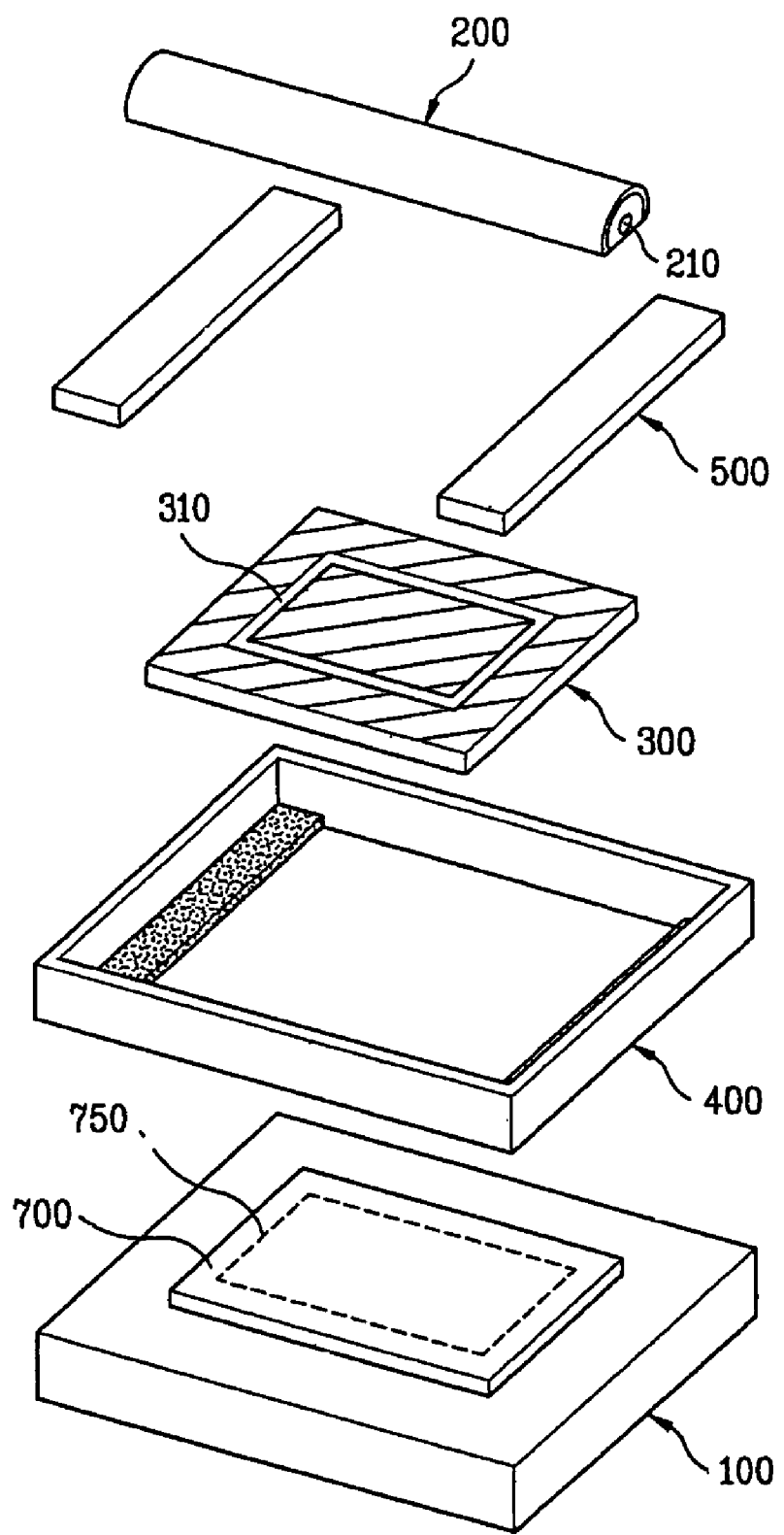
FIG. 3 is an expanded perspective view illustrating a UV emitting device according to the present invention.

FIG. 3 is an expanded perspective view illustrating a UV emitting device according to the present invention.

Referring to FIG. 3, a UV emitting device according to the present invention includes a substrate stage 100, a UV source unit 200, a mask 300 formed between the substrate stage 100 and the UV source unit 200, and lower and upper parts 400 and 500 securing the mask 300.

Attached substrates 700 in which a sealant 750 is formed thereon are loaded on the substrate stage 100. The substrate stage 100 may be moved by using a conveyer belt, or the like, for mass production.

A UV lamp 210 is formed in the UV source unit 200. Although only one UV lamp is illustrated in the drawing, a plurality of UV lamps may be installed as a substrate size increases.

The mask 300 has the same pattern 310 as that of the sealant 750 so that UV-rays are irradiated to the area of the attached substrate 700 where the sealant 750 is formed. Therefore, the mask pattern 310 may be changed depending on variation of the pattern of the sealant 750 with different models.

The mask 300 is placed and secured between the lower and upper parts 400 and 500. Shapes of the lower and upper parts 400 and 500 and a method of securing the mask 300 to the mask holders are explained as follows.

Figure 4A:
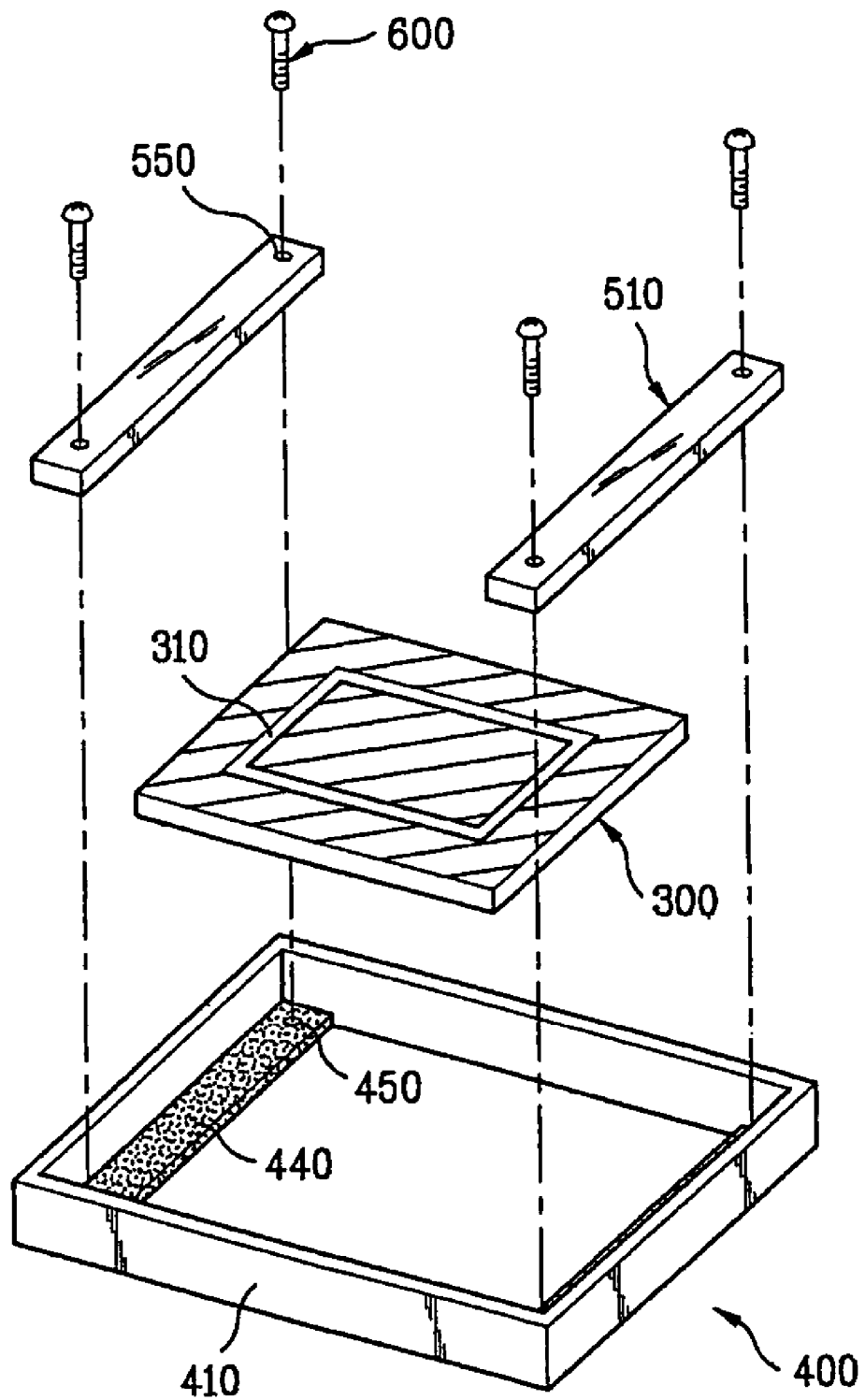
FIG. 4A is an expanded perspective view illustrating a mask holder according to a first embodiment of the present invention.
Figure 4B:
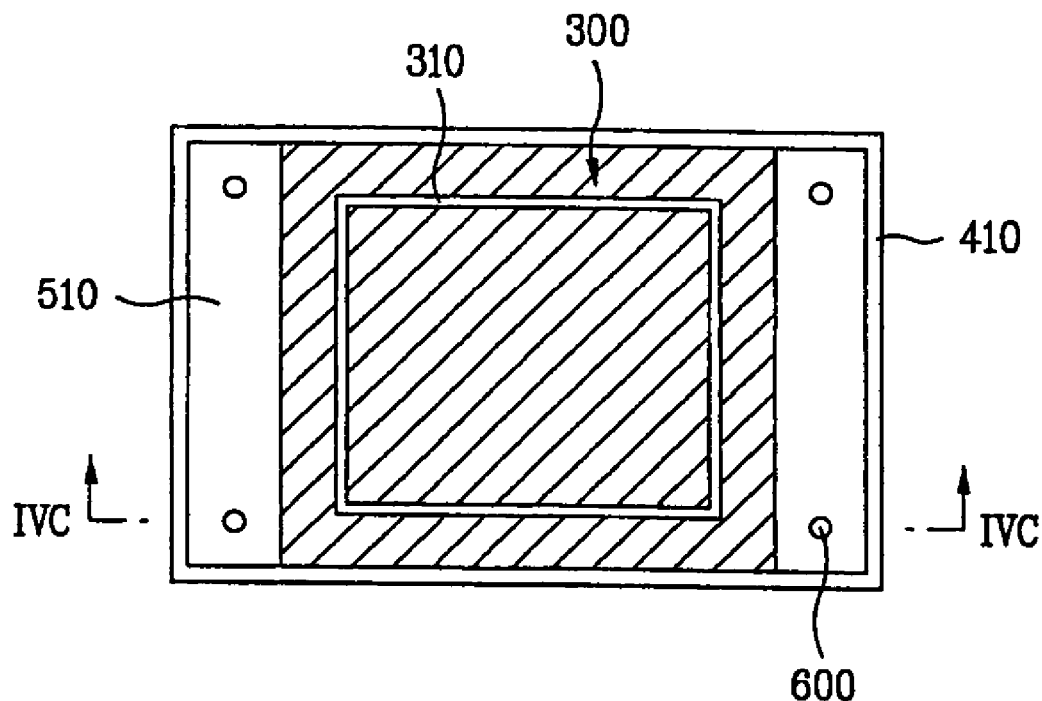
FIG. 4B illustrates a layout of a mask secured by the mask holder of FIG. 4A.
Figure 4C:
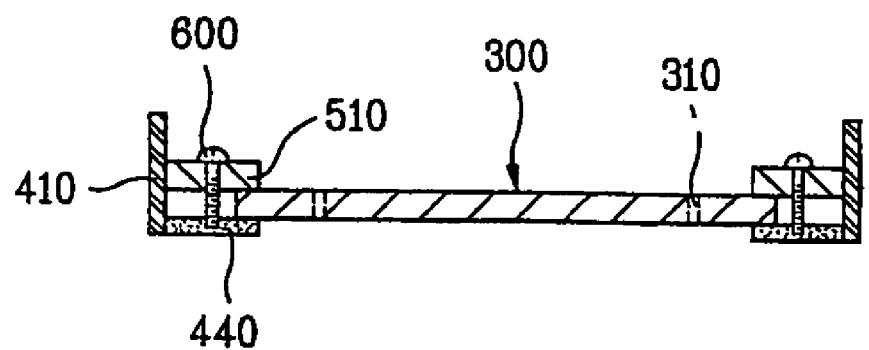
FIG. 4C illustrates a cross-sectional view taken along line IVC-IVC of FIG. 4B.

FIG. 4A is an expanded perspective view illustrating a mask holder according to a first embodiment of the present invention. FIG. 4B illustrates a layout of a mask secured by the mask holder of FIG. 4A. FIG. 4C illustrates a cross-sectional view taken along line IVC-IVC of FIG. 4B.

Referring to FIG. 4A, a mask holder according to a first embodiment of the present invention includes a lower part 400, an upper part 510, and connecting members 600 connecting the upper part 510 and the lower part 400.

In this case, the lower part 400 includes a rectangular frame 410 and plate members 440. First connecting portions 450 are formed at each of the plate members 440.

The plate members 440 support the mask 300 and are formed at the right and left sides of the rectangular frame 410. The plate members 440 may also be formed at the upper and lower sides of the rectangular frame 410.

The upper part 510 includes a pair of straight bars. Second connecting portions 550 are formed at the upper part 510 and correspond to the first connecting portions 450 of the plate members 440.

The upper part 510 is fastened to the plate members 440 formed inside the rectangular frame 410 and has a size matching the plate members 440.

A method of securing a mask to the above-explained mask holder, as shown in FIGS. 4B and 4C, includes aligning the mask 300 with the plate members 440 of the lower part 400, placing the upper part 510 over the mask 300, and putting the connecting member 600 into the first and second connecting portions 450 and 550 of the plate members 440 and upper part 510, respectively, to secure the mask 300.

Meanwhile, as mentioned in the foregoing explanation, since a pattern of the mask 300 may be changed according to a product model, the mask 300 may also be replaced. Hence, the connecting member 600 does not permanently secure the upper part 510 to the lower part 400 but is detachable like bolts and the like.

Moreover, UV-rays pass through the pattern 310 of the mask 300 so as to be irradiated onto the sealant of the attached substrate. If a portion of the pattern 310 of the mask 300 overlaps the plate members 440, the UV-rays cannot be irradiated to the sealant of the attached substrate. Therefore, the plate members 440 of the lower part 400 securing the mask 300 and the upper part 510 may be formed of a UV transparent material, such as acryl, quartz, and the like.

Figure 5:
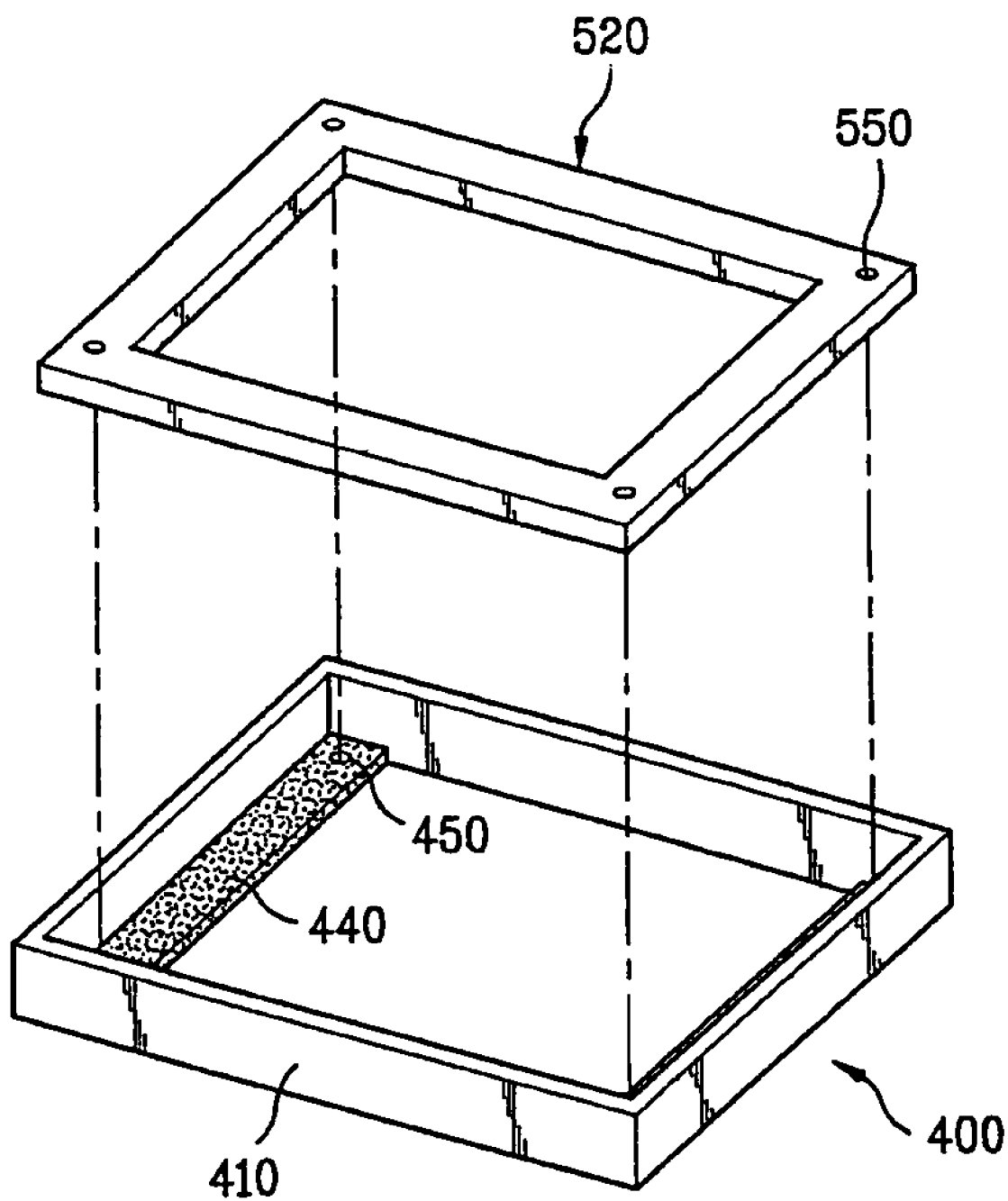
FIGS. 5 to 7 illustrate mask holders for a UV emitting device according to second, third, and fourth embodiments of the present invention, respectively.
Figure 6:
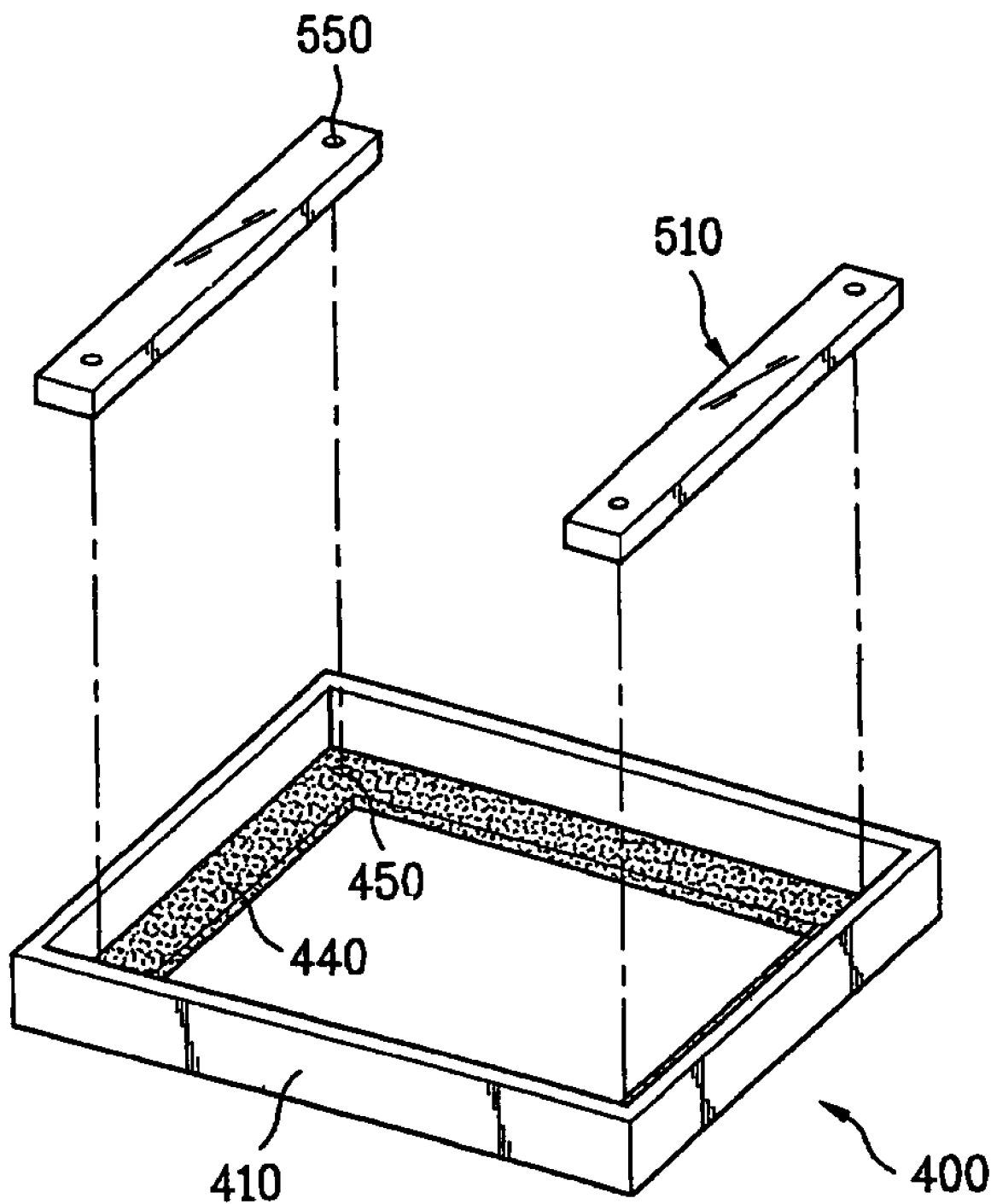
Figure 7:
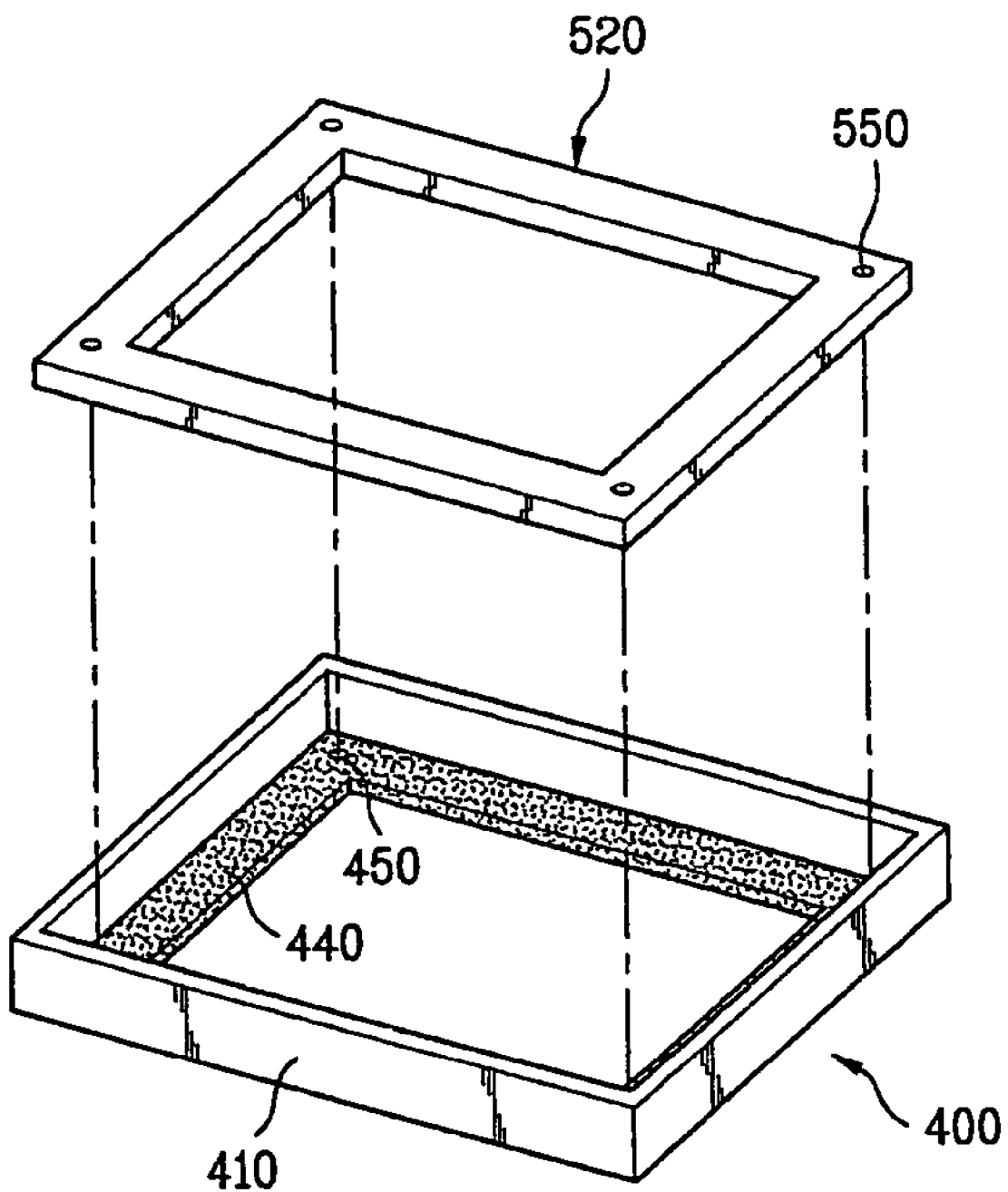

FIGS. 5 to 7 illustrate mask holders for a UV emitting device according to second, third, and fourth embodiments of the present invention, respectively, in which a mask is placed and secured between the lower and upper parts, as shown in the first embodiment.

A mask holder according to a second embodiment of the present invention in FIG. 5 is similar to that of the first embodiment in FIG. 4A, except for the shape of the upper part. Therefore, the same numerals are used in FIG. 5, and explanations will be omitted for simplicity.

The mask holder according to a second embodiment of the present invention, as shown in FIG. 5, includes a rectangular member 520 as an upper part instead of a pair of the straight bars. The rectangular member 520 secures the mask with better stability.

A mask holder according to a third embodiment of the present invention, as shown in FIG. 6, includes a plate member 440 formed at all four sides inside the lower part 400. The other parts of the third embodiment are the same as those of the mask holder of the first embodiment shown in FIG. 4A.

A mask holder according to a fourth embodiment of the present invention, as shown in FIG. 7, includes a plate member 440 formed at all four sides inside the lower part 400 and a rectangular member 520 as an upper part.

Thus, a contact area between the mask and the mask holder supporting the mask is increased, thereby securing the mask with better stability.

Figure 8A:
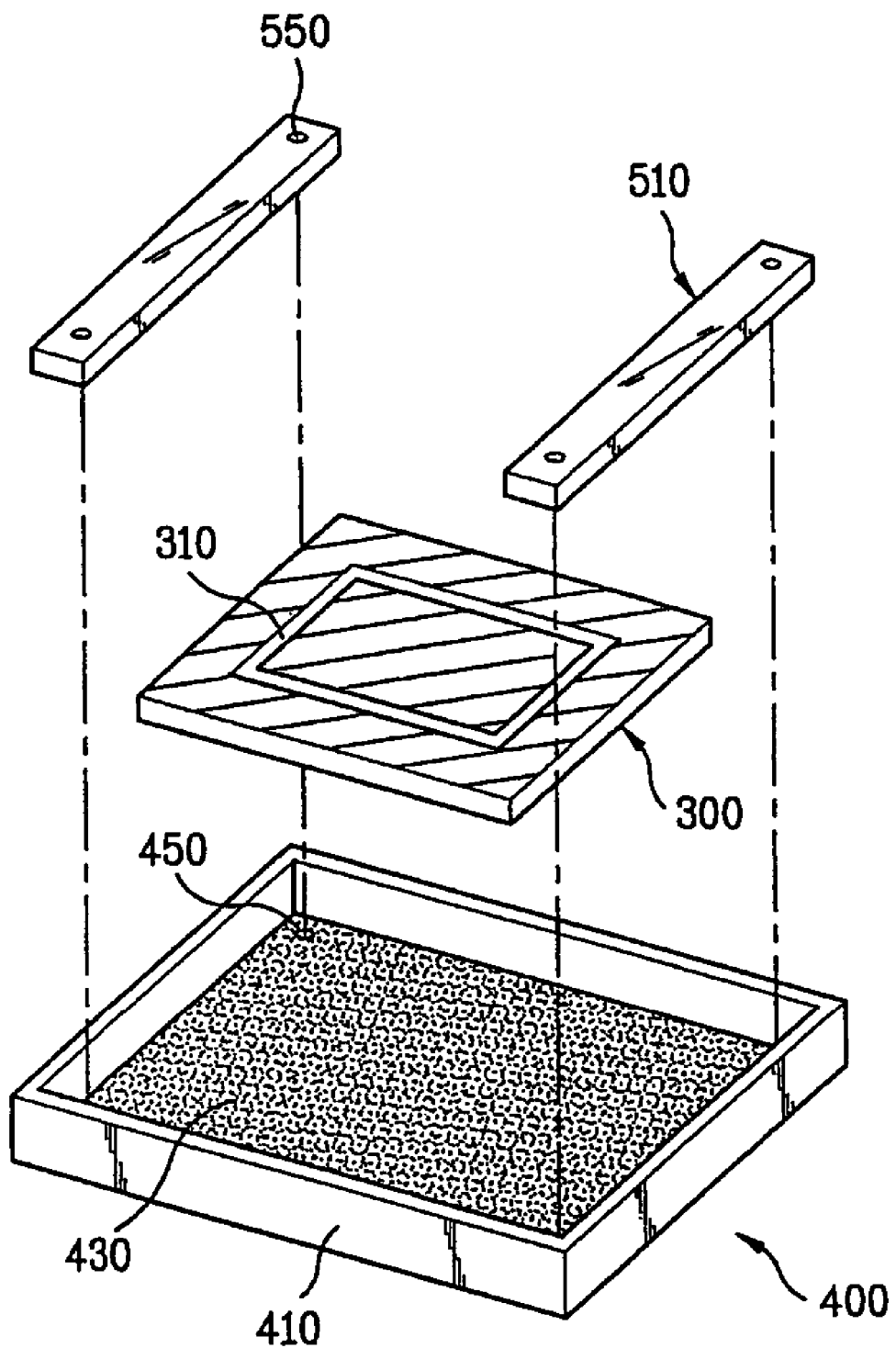
FIG. 8A is an expanded perspective view illustrating a mask holder according to a fifth embodiment of the present invention.
Figure 8B:
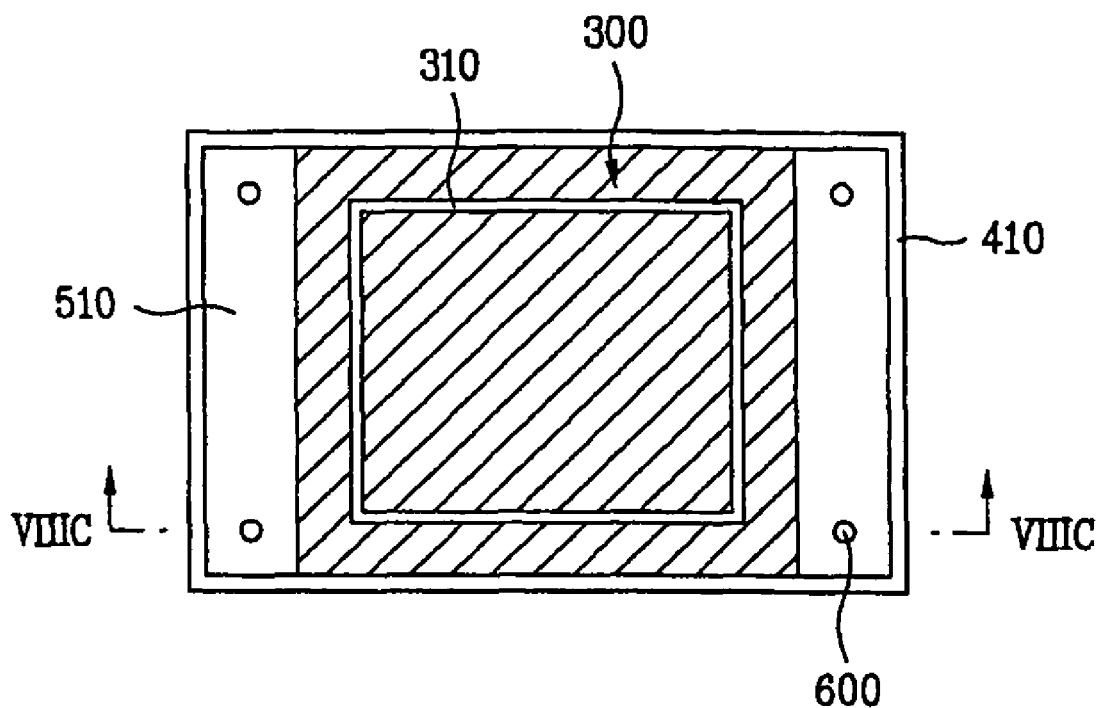
FIG. 8B illustrates a layout of a mask secured by the mask holder of FIG. 8A.
Figure 8C:
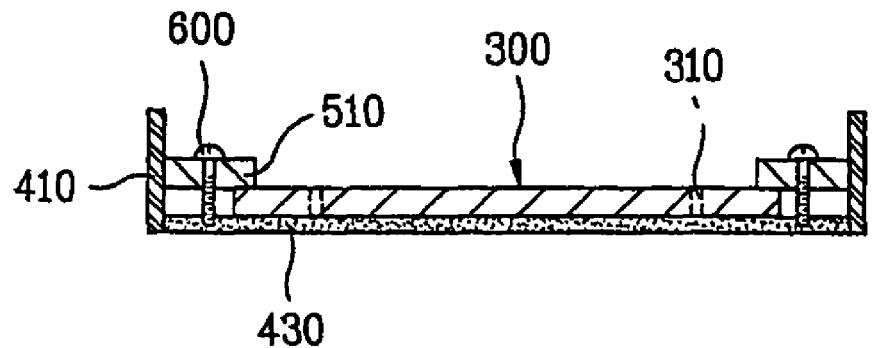
FIG. 8C illustrates a cross-sectional view taken along line VIIIC-VIIIC of FIG. 8B.

FIG. 8A is an expanded perspective view illustrating a mask holder according to a fifth embodiment of the present invention. FIG. 8B illustrates a layout of a mask secured by the mask holder of FIG. 8A. FIG. 8C illustrates a cross-sectional view taken along line VIIIC-VIIIC of FIG. 8B.

A mask holder according to a fifth embodiment of the present invention, as shown in FIGS. 8A to 8C, includes a plate 430 located at the bottom inside a rectangular frame 410 of a lower part 400 and supporting the entire side of the mask. Therefore, a contact area between the mask and the mask holder is maximized, thereby securing the mask with better stability.

In this case, the plate 430 is formed of a UV transparent material, such as acryl or quartz, so that the UV-rays are irradiated to the pattern formed in the mask. The other parts are similar to those of the mask holder shown in FIG. 4A, and the same numerals are used for the same parts.

Figure 9:
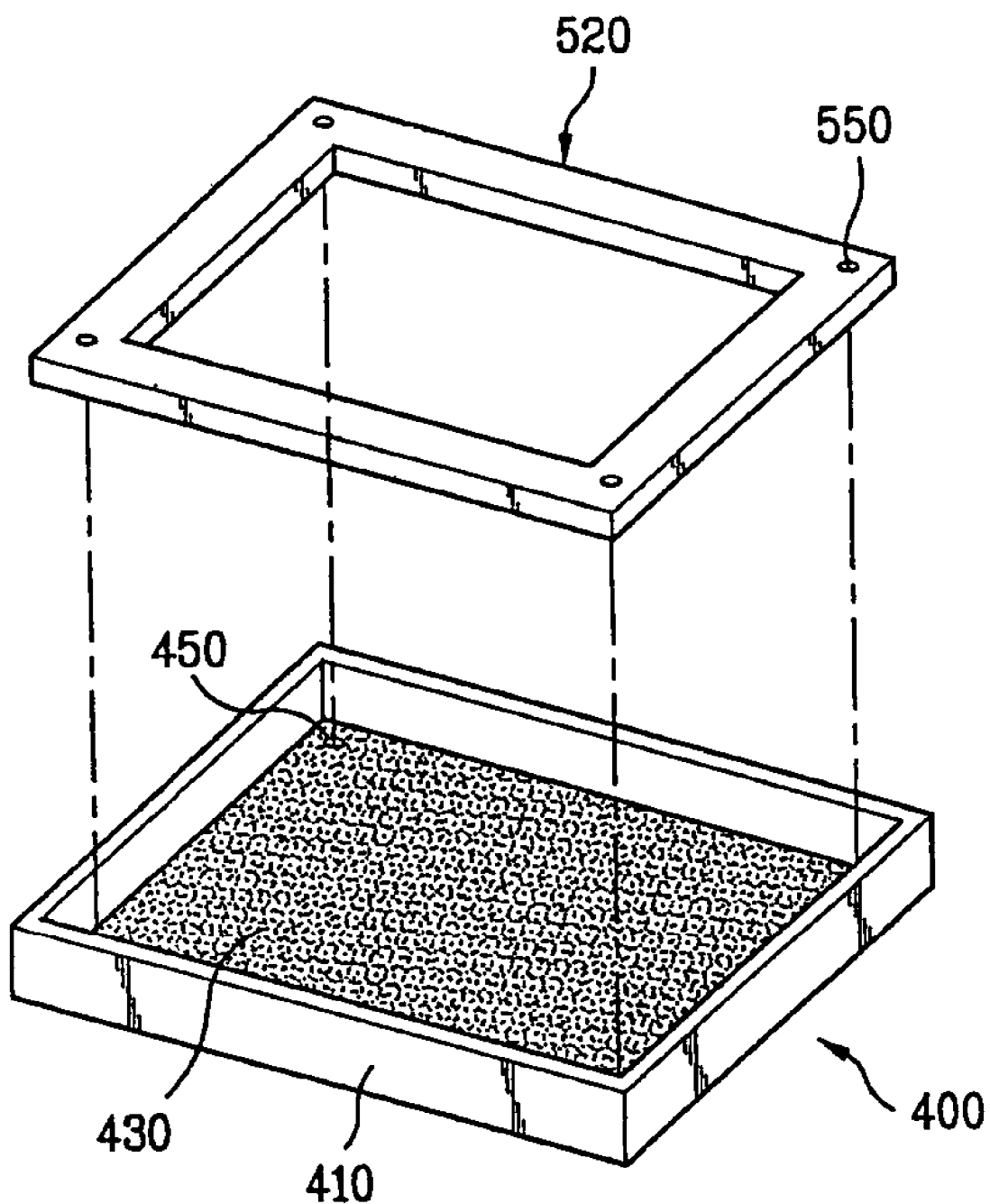
FIG. 9 is an expanded perspective view illustrating a mask holder for a UV emitting device according to a sixth embodiment of the present invention.

FIG. 9 is an expanded perspective view illustrating a mask holder for a UV emitting device according to a sixth embodiment of the present invention. The mask holder is similar to that of the first embodiment shown in FIG. 4A except for the upper part. In this embodiment, a rectangular member 520 is used for the upper part.

Figure 10A:
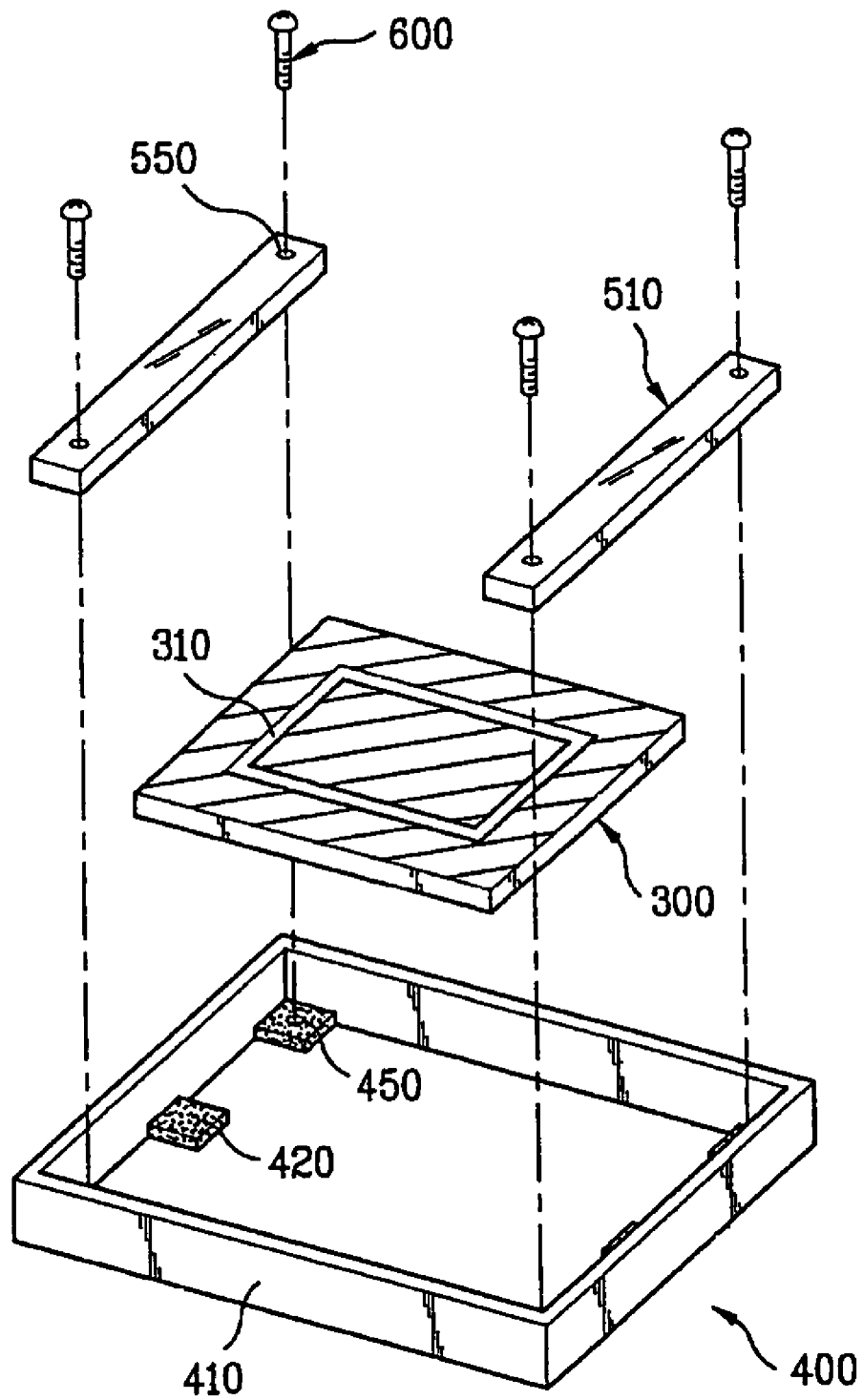
FIG. 10A is an expanded perspective view illustrating a mask holder according to a seventh embodiment of the present invention.
Figure 10B:
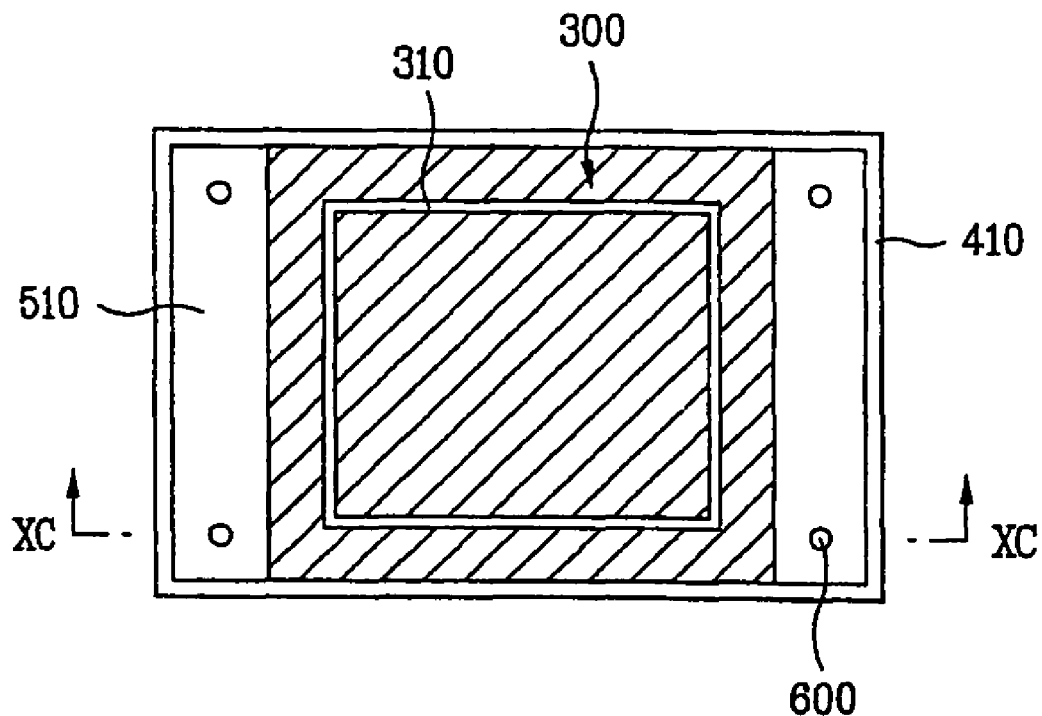
FIG. 10B illustrates a layout of a mask secured by the mask holder of FIG. 10A.
Figure 10C:
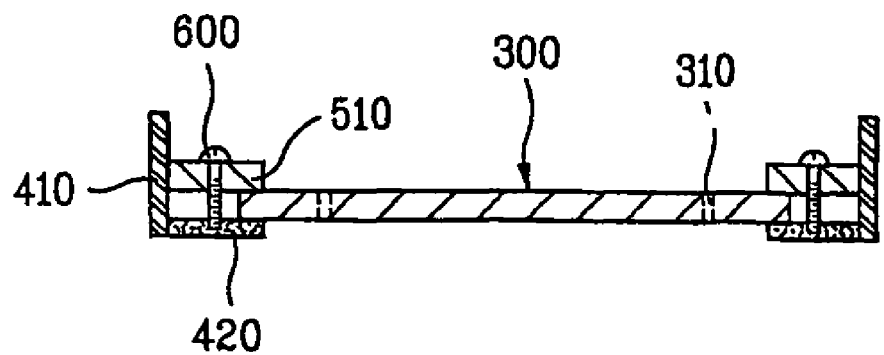
FIG. 10C illustrates a cross-sectional view taken along line XC-XC of FIG. 10B.

FIG. 10A is a perspective view illustrating a mask holder according to a seventh embodiment of the present invention. FIG. 10B illustrates a layout of a mask secured by the mask holder of FIG. 10A. FIG. 10C illustrates a cross-sectional view taken along line XC-XC of FIG. 10B.

Referring to FIG. 10A, a mask holder according to a seventh embodiment of the present invention includes a lower part 400, an upper part 510, and a connecting member 600 connecting the upper part 510 into the lower part 400.

In this case, the lower part 400 includes a rectangular frame 410 and a plurality of protrusion members 420 formed inside the rectangular frame 410. First connecting portions 450 are formed at each of the protrusion members 420 at the corners of the rectangular frame 410.

The protrusion members 420 support the mask. A plurality of the protrusion members 420 are formed on the right and left sides of the rectangular frame 410. The protrusion members 420 may also be formed at the upper and lower sides of the rectangular frame 410.

The upper part 510 includes a pair of straight bars. Second connecting portions 550 are formed at the upper part 510 and correspond to the first connecting portions 450 of the protrusion members 420.

The upper part 510 is fastened to the protrusion members 420 formed inside the rectangular frame 410 and having a size matching the rectangular frame 410.

Meanwhile, as mentioned in the foregoing explanation, since a pattern of the mask 300 may be changed with a different product model, the mask 300 may also be replaced. Hence, the connecting member 600 does not permanently secure the upper part 510 to the lower part 400 but may be detachable like bolts and the like.

Moreover, the UV-rays pass through the pattern 310 of the mask 300 so as to be irradiated to the sealant of the attached substrate. If a portion of the pattern 310 of the mask 300 overlaps the protrusion members 420, the UV-rays cannot be irradiated to the sealant of the attached substrate. Therefore, the protrusion members 420 of the lower part 400 securing the mask 300 and the upper part 510 are formed of a UV transparent material, such as acryl, quartz, and the like.

Figure 11:
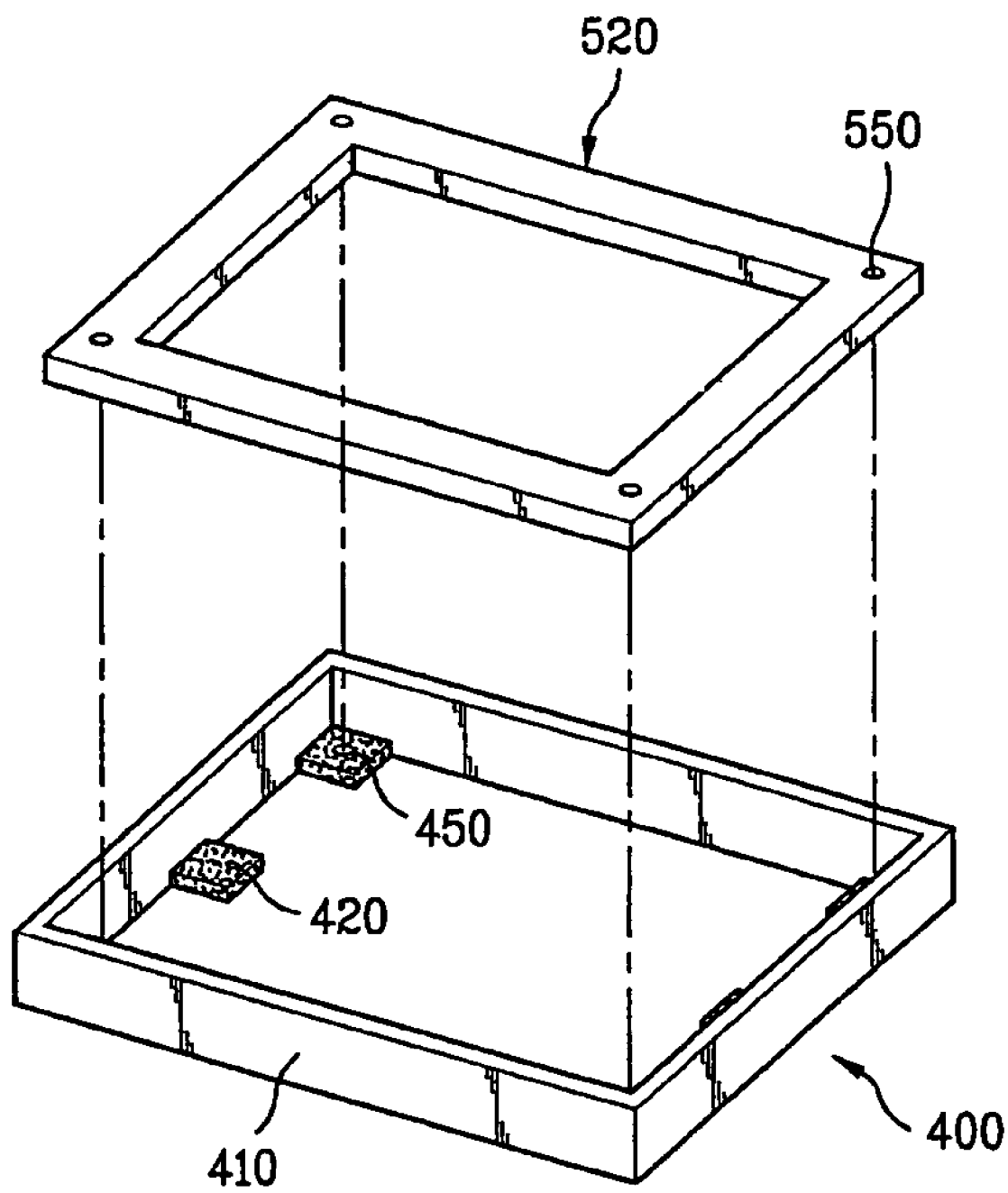
FIGS. 11 to 13 illustrate mask holders for a UV emitting device according to eighth, ninth, and tenth embodiments of the present invention, respectively.
Figure 12:
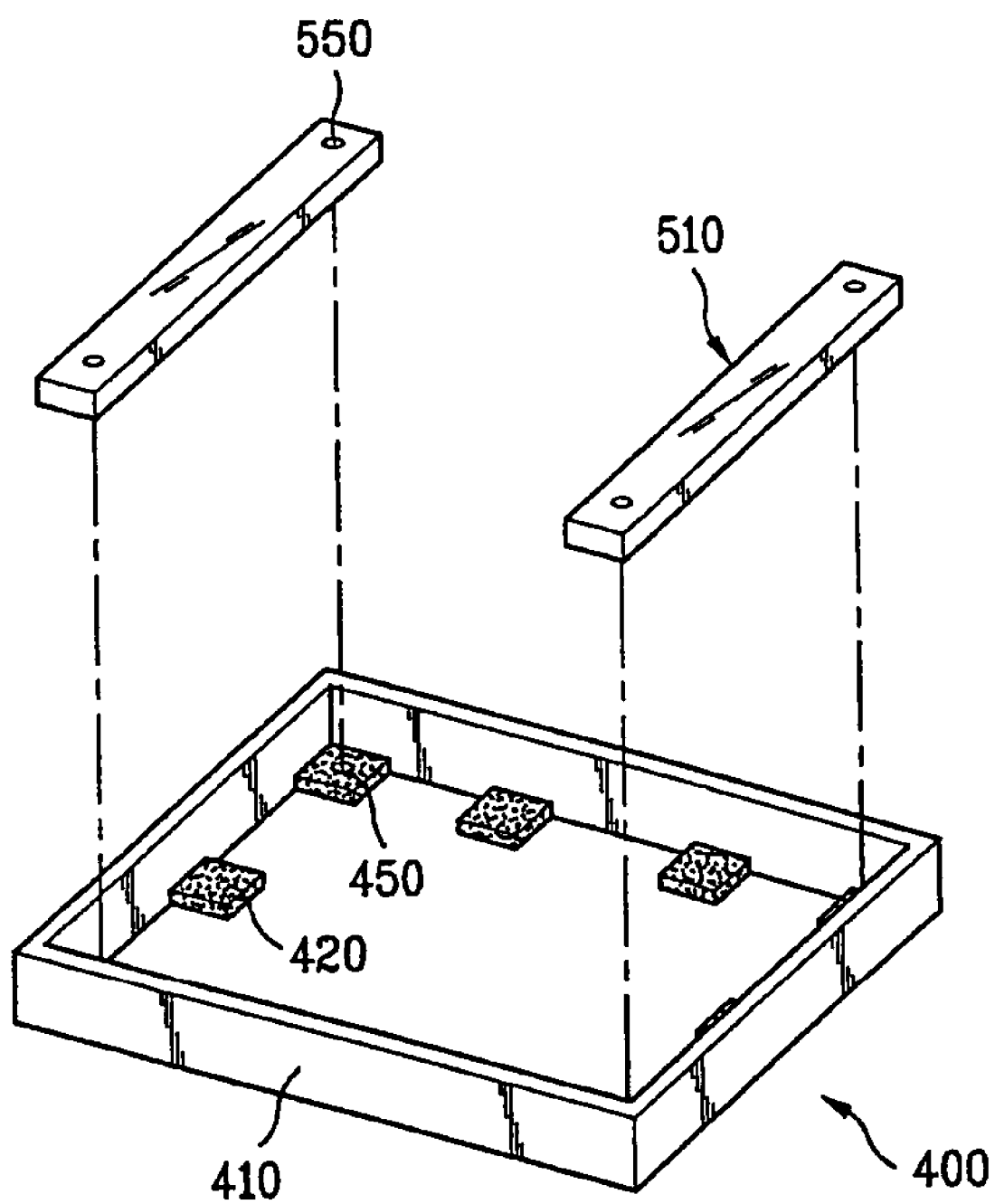
Figure 13:
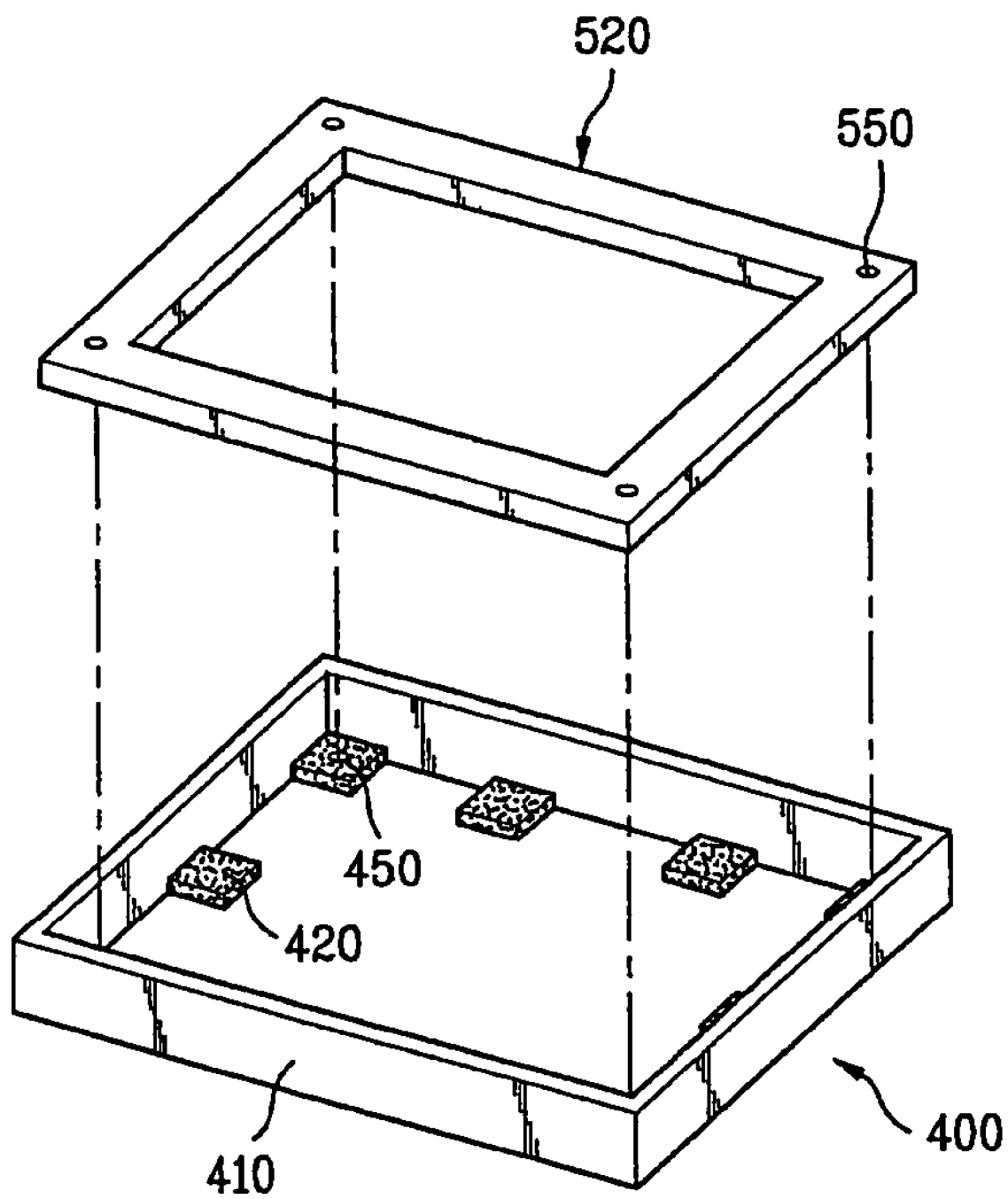

FIGS. 11 to 13 illustrate mask holders for a UV emitting device according to eighth, ninth, and tenth embodiments of the present invention, respectively.

A mask holder according to the eighth embodiment of the present invention, as shown in FIG. 11, includes a rectangular frame 520 as an upper part instead of a pair of the straight bars. The other parts are similar to those of the mask holder according to the seventh embodiment of the present invention.

A mask holder according to the ninth embodiment of the present invention, as shown in FIG. 12, includes a plurality of protrusion members 420 formed at all four sides inside the lower part 400 instead of the left and right sides or the upper and lower sides of the lower part 400. The other parts are the same as those of the mask holder according to the seventh embodiment of the present invention.

A mask holder according to the tenth embodiment of the present invention, as shown in FIG. 13, includes a plurality of protrusion members 420 formed at all four sides inside the lower part 400 and a rectangular frame 520 as an upper part.

If more pieces of the protrusion members 420 in the lower part 400 is used or the rectangular frame 520 is used as the upper part, the mask may be supported more stably. However, a contact area between the mask and the mask holder is increased, so that the UV-rays may not be irradiated to the mask pattern depending on the sealant pattern. Hence, the sealant may not be hardened.

Therefore, the protrusion members 420 and the rectangular frame 520 may be formed of a UV transparent material, such as acryl, quartz, and the like.

Figure 14A:
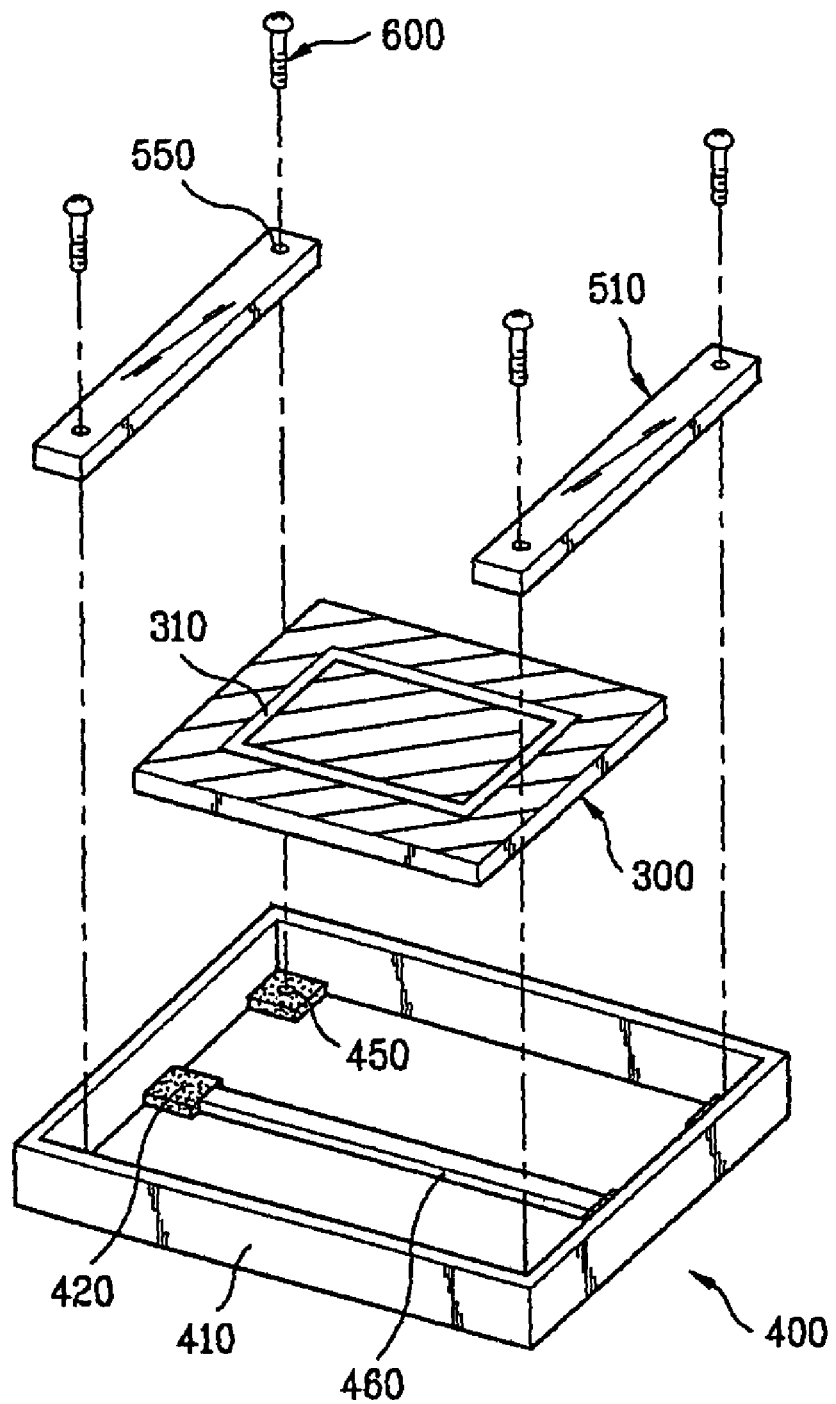
FIG. 14A is an expanded perspective view illustrating a mask holder according to an eleventh embodiment of the present invention.
Figure 14B:
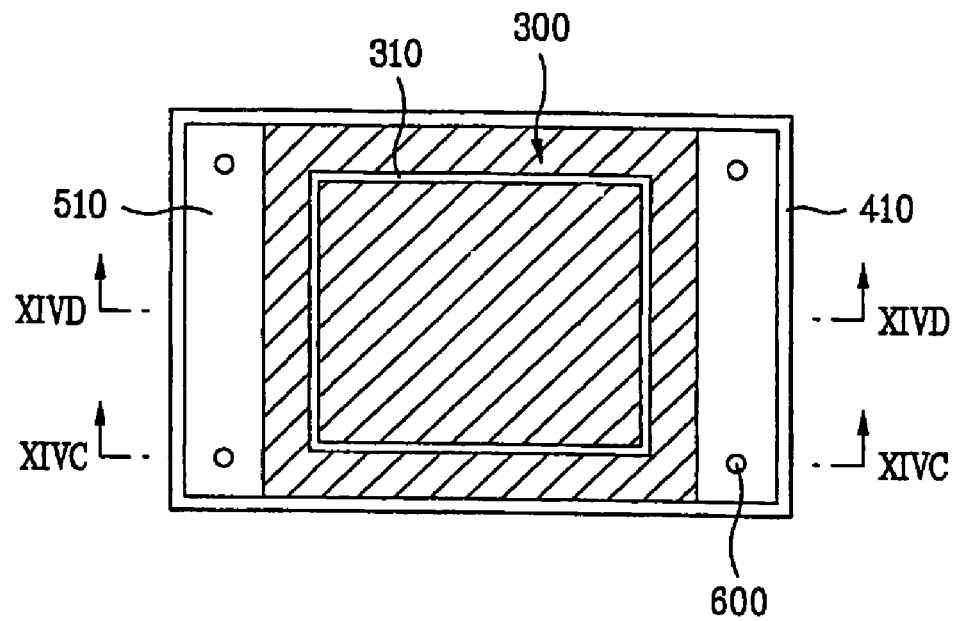
FIG. 14B illustrates a layout of a mask secured by the mask holder of FIG. 14A.
Figure 14C:
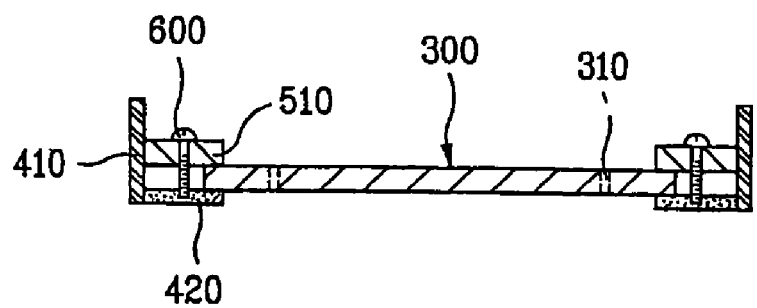
FIG. 14C illustrates a cross-sectional view taken along line XIVC-XIVC of FIG. 14B.
Figure 14D:
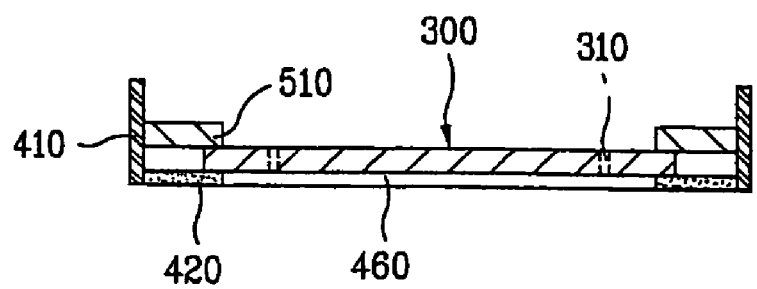
FIG. 14D illustrates a cross-sectional view taken along line XIVD-XIVD of FIG. 14B.

FIG. 14A is an expanded perspective view illustrating a mask holder according to an eleventh embodiment of the present invention. FIG. 14B illustrates a layout of a mask secured by the mask holder of FIG. 14A. FIG. 14C illustrates a cross-sectional view taken along line XIVC-XIVC of FIG. 14B. FIG. 14D illustrates a cross-sectional view taken along line XIVD-XIVD of FIG. 14B.

Referring to FIG. 14A, a mask holder according to an eleventh embodiment of the present invention includes a lower part 400, an upper part 510, and a connecting member 600 connecting the upper part 510 into the lower part 400.

In this case, the lower part 400 includes a rectangular frame 410, a plurality of protrusion members 420 formed inside the rectangular frame 410, and a supporting bar 460 attached to two of the protrusion members 420. First connecting portions 450 are formed at each of the protrusion members 420 at the corners of the rectangular frame 410.

The protrusion members 420 are the main support for the mask, and the supporting bar 460 is a secondary mask support. More specifically, when a size of the substrate increases, the mask also increases accordingly. Hence, the central portion of the mask may be bent down if the mask is supported only by the protrusion members 420. Therefore, the supporting bar 460 prevents such a problem.

In this case, a portion of the pattern 310 of the mask 300 through which the UV-rays are irradiated to the sealant in the attached substrate overlaps the supporting bar 460 as the secondary mask support. Hence, the supporting bar 460 is formed of a UV transparent material, such as acryl, quartz, and the like.

As shown in the drawing, protrusion members 420 and the supporting bar 460 are formed at the right and left sides of the rectangular frame 410, respectively. The protrusion members 420 and the supporting bar 460 may also be formed at the upper and lower sides of the rectangular frame 410, respectively. Moreover, widths of the protrusion members 420 and the supporting bar 460 may be varied with other conditions. Also, more than one supporting bars 460 may be installed in the lower part 400.

The upper part 510 includes a pair of straight bars. Second connecting portions 550 are formed at the upper part 510 and correspond to the first connecting portions 450 of the protrusion members 420.

The upper part 510 is fastened into the protrusion members 420 formed inside the rectangular frame 410 so as to have a size matching the rectangular frame 410.

Meanwhile, as mentioned in the foregoing explanation, since a pattern of the mask 300 may be changed according to a product model, the mask 300 may also be replaced. Hence, the connecting member 600 does not permanently secure the upper part 510 to the lower part 400 and may be detachable like bolts and the like.

Moreover, the UV-rays pass through the pattern 310 of the mask 300 so as to be irradiated to the sealant of the attached substrate. If a portion of the pattern 310 of the mask 300 overlaps the protrusion members 420, the UV-rays cannot be irradiated to the sealant of the attached substrate. Therefore, the protrusion members 420 of the lower part 400 holding the mask 300 and the upper part 510 are formed of a UV transparent material, such as acryl, quartz, and the like.

Figure 15A:
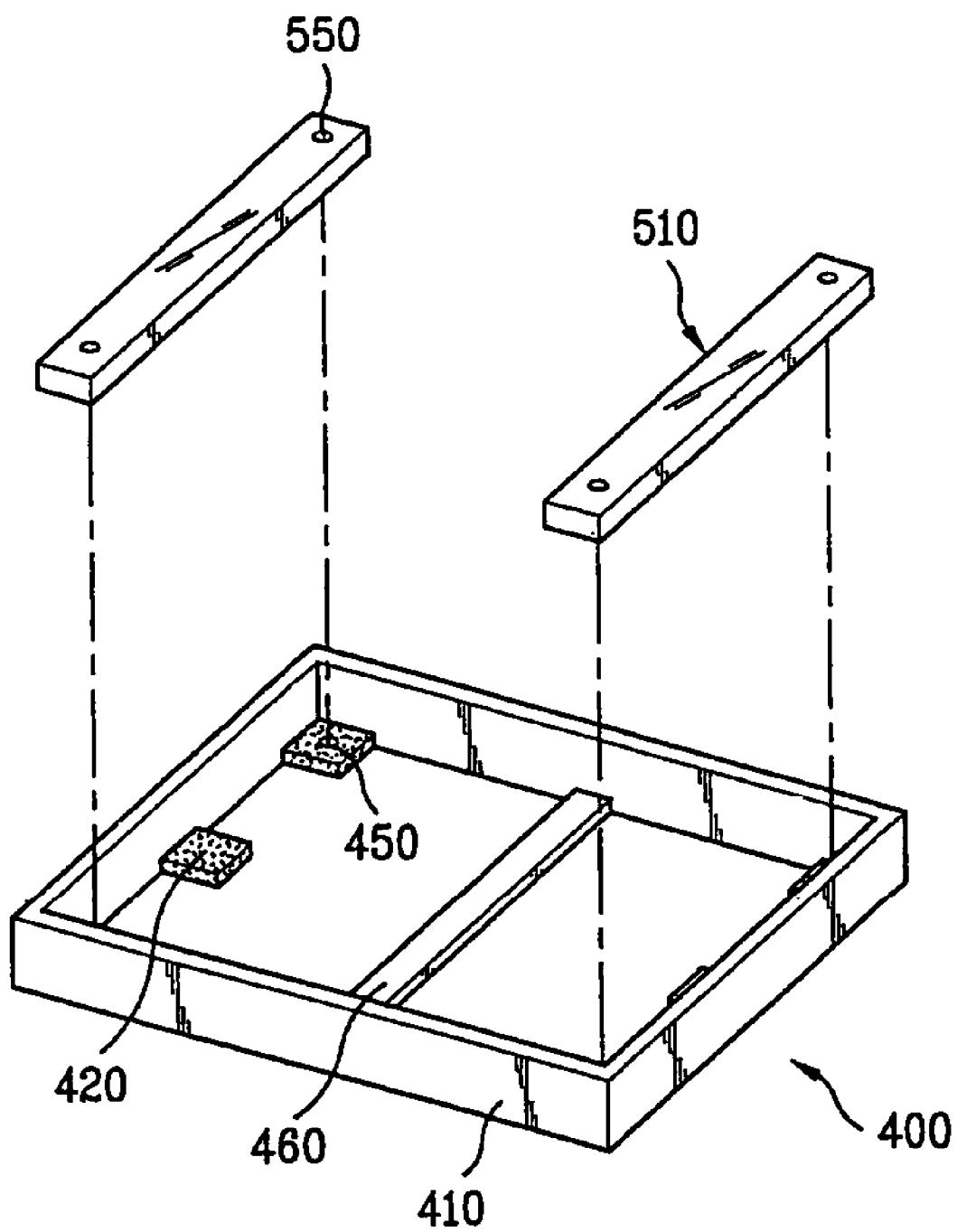
FIGS. 15A and 15B are expanded perspective views illustrating mask holders according to a twelfth embodiment of the present invention.
Figure 15B:
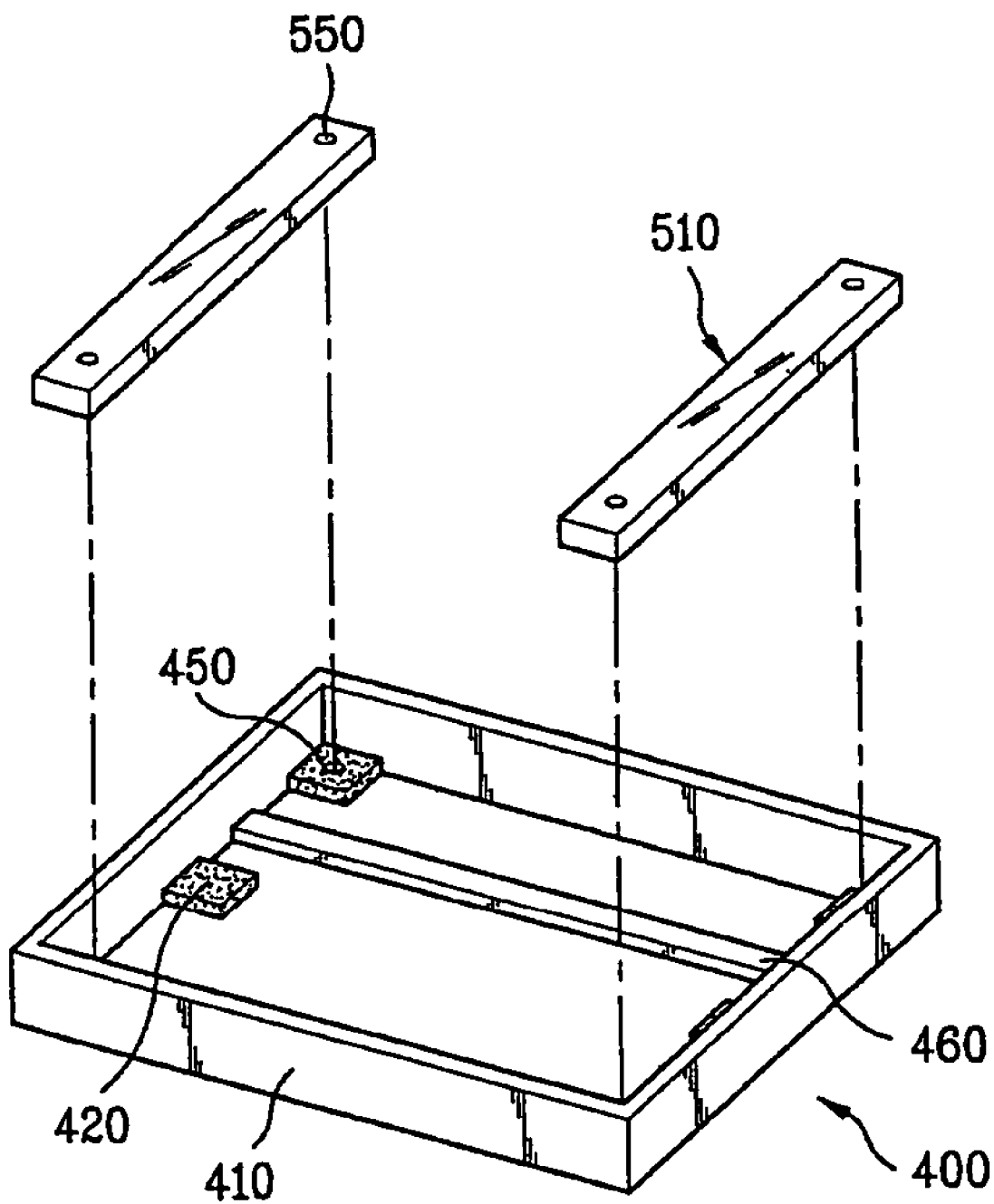
Figure 16:
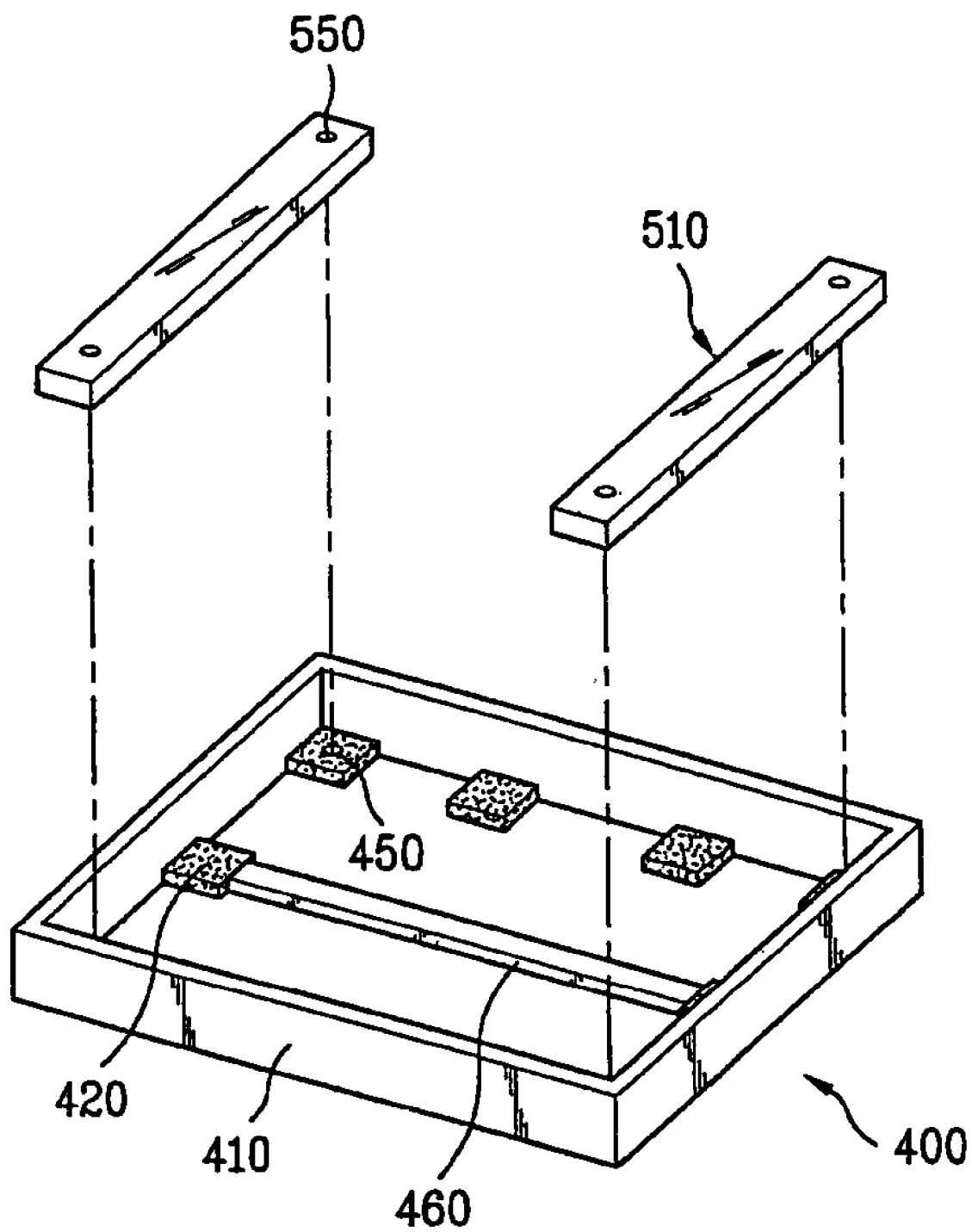
FIGS. 16 to 20 illustrate mask holders according to thirteenth, fourteenth, fifteenth, sixteenth, and seventeenth embodiments of the present invention, respectively.
Figure 17:
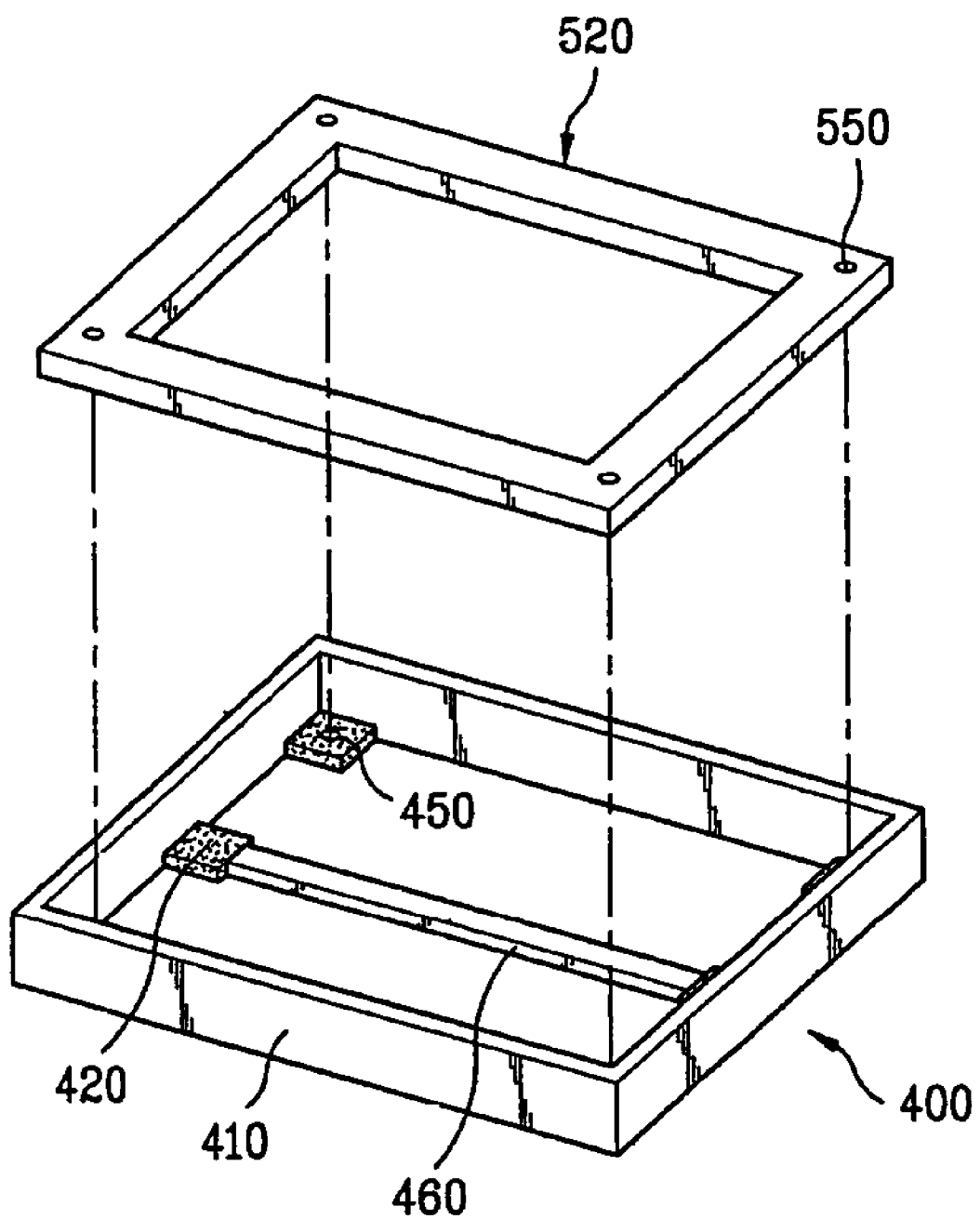
Figure 18:
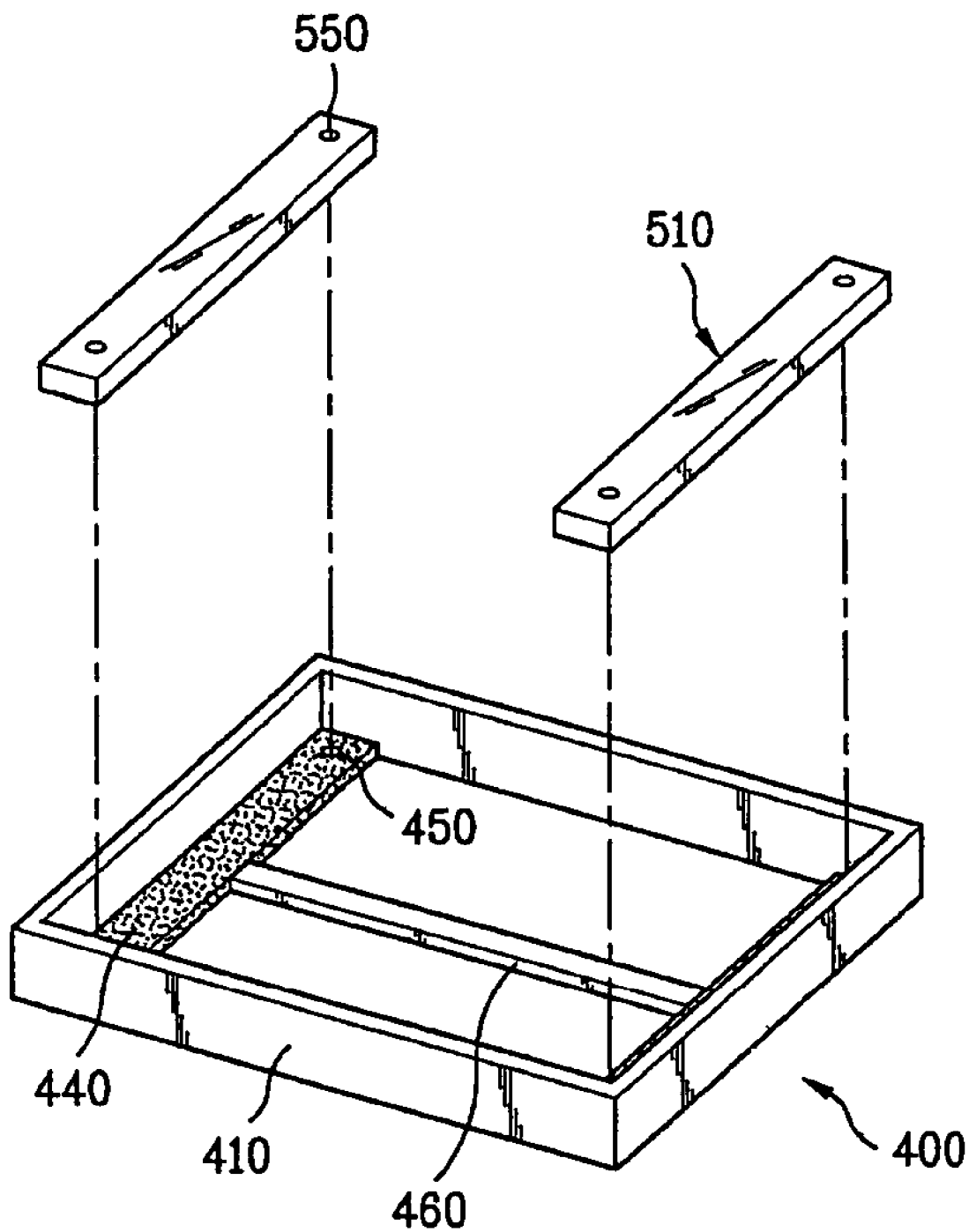
Figure 19:
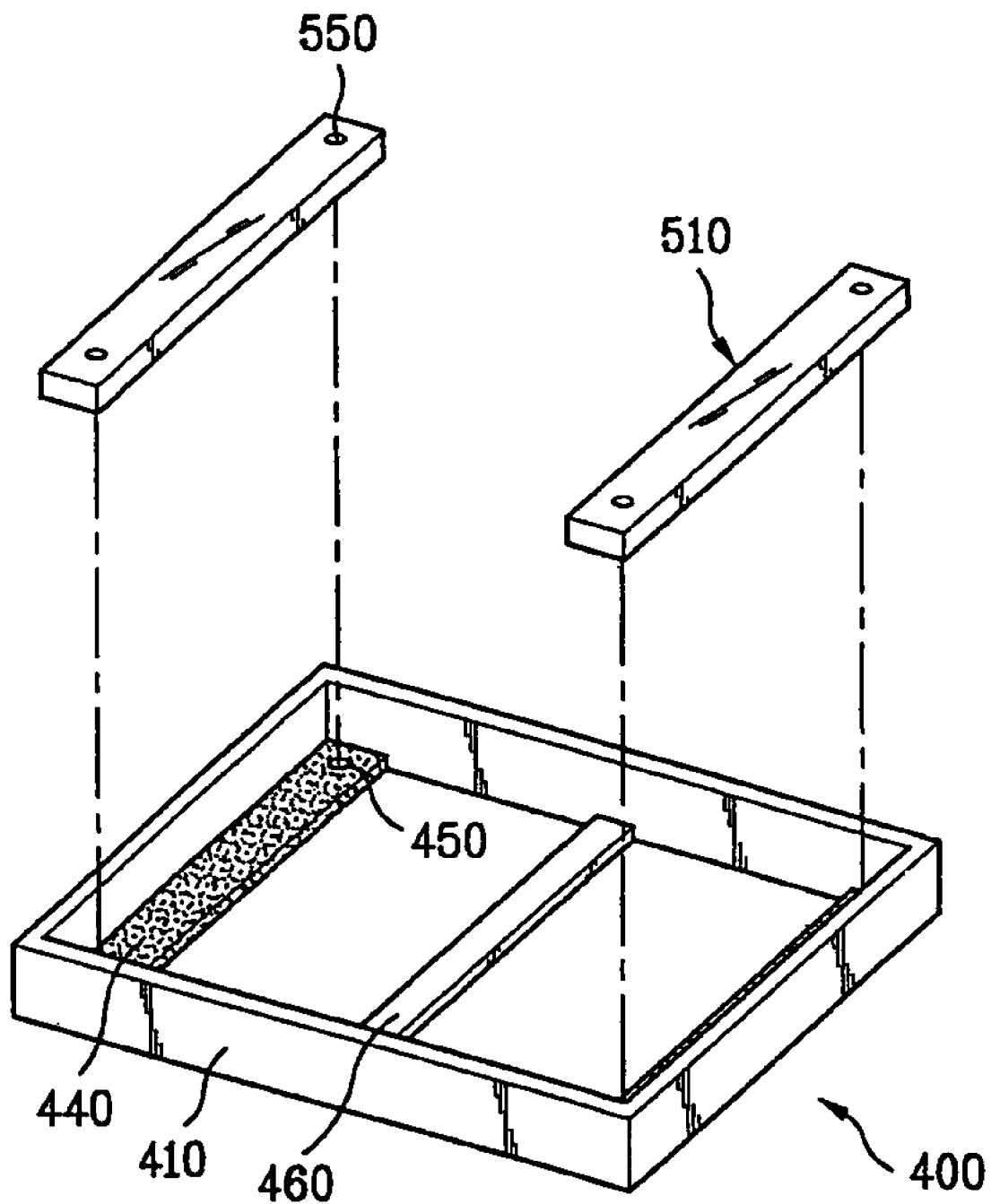
Figure 20:
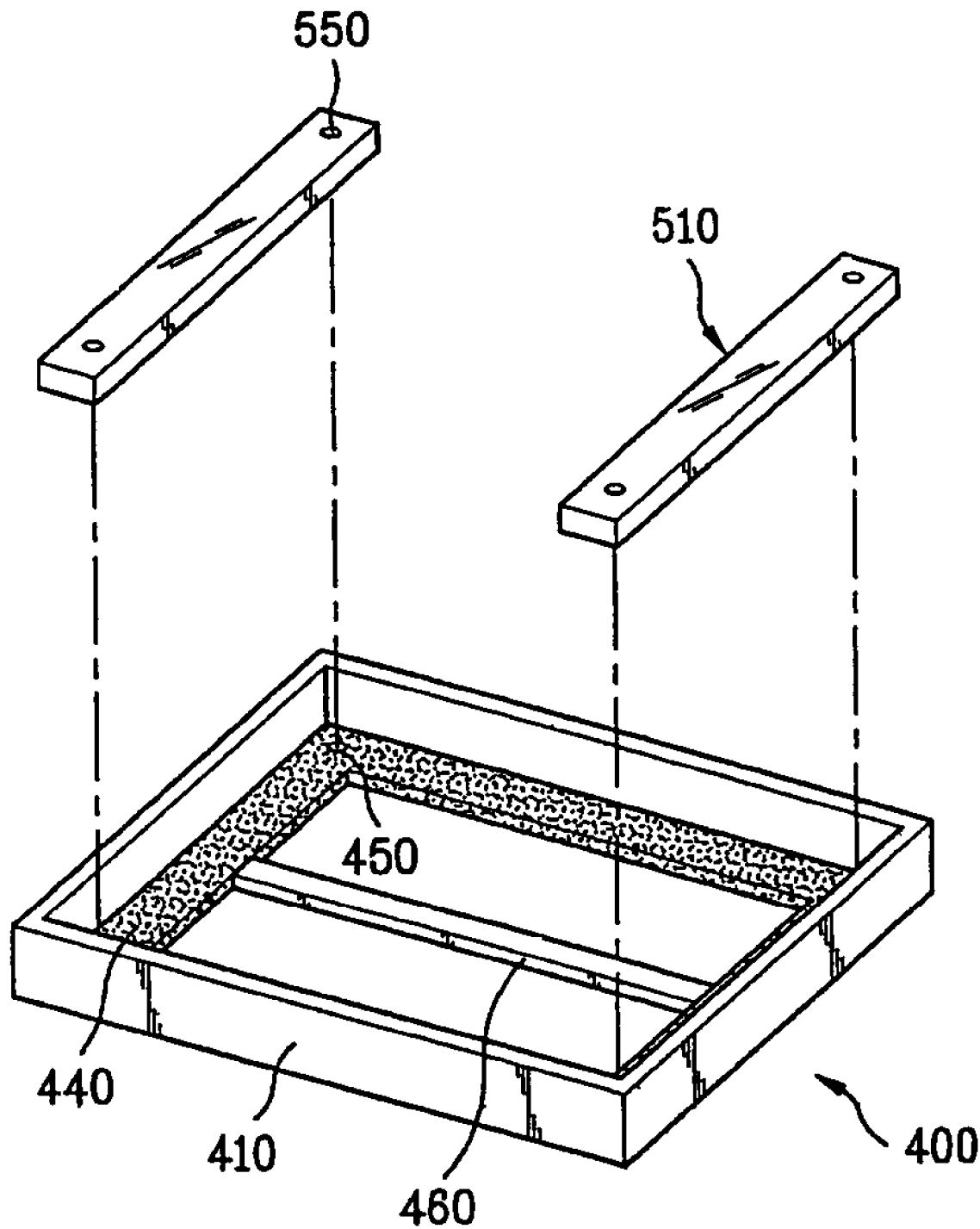

FIGS. 15A and 15B are expanded perspective views illustrating mask holders according to a twelfth embodiment of the present invention, in which a supporting bar 460 is connected to inner sides of a rectangular frame 410 where the protrusion members 420 are not attached and the other parts are similar to those of the eleventh embodiment of the present invention. Hence, the same numerals are used to the other parts.

Referring to FIG. 15A, the supporting bar 460 is connected to inner sides of the rectangular frame 410 without forming the protrusion members 420 thereon. Referring to FIG. 15B, the supporting bar 460 is connected to inner faces of the rectangular frame 410 between a plurality of the protrusion members 420.

FIGS. 16 to 20 illustrate mask holders according to thirteenth, fourteenth, fifteenth, sixteenth, and seventeenth embodiments of the present invention, respectively.

Referring to FIGS. 16 to 20, mask holders according to the thirteenth to seventeenth embodiments of the present invention are various combinations of the above-described embodiments of the present invention.

Accordingly, the present invention is to irradiate UV-rays only on a sealant-formed area to harden a UV-hardening sealant without degrading characteristics of devices on the substrates, such as the alignment layers, the thin film transistors, and the like.

Moreover, the mask holder according to the present invention effectively secures the mask, and may be varied with the mask patterns regardless of changes in the sealant pattern.

It will be apparent to those skilled in the art that various modifications and variations can be made in the mask holder for irradiating UV-rays of the present invention without departing from the spirit or scope of the inventions. Thus, it is intended that the present invention covers the modifications and variations of this invention provided they come within the scope of the appended claims and their equivalents.

What is claimed is:

1. A method of manufacturing a liquid crystal display (LCD) device comprising:
preparing a first substrate and a second substrate;
forming a sealant on one of the first and second substrates;
applying liquid crystal on one of the first and second substrates; and
attaching the first and second substrates;
curing the sealant by irradiating UV light through a mask, wherein the mask is supported by a mask holder,
wherein the mask holder includes:
a lower part having a frame and a mask supporting member supporting a mask under the mask, wherein the mask supporting member directly contacts with a lower surface of the mask in the frame and has a plurality of first connecting holes formed in the mask supporting member; and
an upper part having a pair of first straight bars and a plurality of second connecting holes, formed in the pair of the first straight bars, to be aligned with the first connecting holes; and
a plurality of connecting members coupled with the plurality of first and second connecting holes, so that the first straight bars are coupled with the mask supporting member;
wherein the frame of the lower part has four side walls,
wherein the pair of first straight bars and the mask are taken within the four side walls of the frame and fixed into the frame and mask supporting member by the four side walls and the connecting members coupled with the first and second connecting holes,
wherein the pair of first straight bars are separated and parallel with each other,
wherein the mask supporting member has a pair of second straight bars that are separated and parallel with each other to correspond to the pair of first straight bars, respectively,
wherein the pair of first straight bars and the pair of second straight bars fix a first side portion and second side portion of the mask, parallel with the first side portion, in the mask,
wherein the first and second side walls of the frame have a long-edge, directly connecting first and second side surfaces of the mask, wherein a long-edge of the frame is parallel to a long-edge of the mask, and wherein the third and fourth side walls of the frame have a short-edge, separated from third and fourth side-surfaces of the mask, wherein a short-edge of the frame is parallel to a short-edge of the mask.

2. The method of claim 1, wherein the mask includes a mask pattern.

3. The method of claim 1, wherein the mask supporting member is formed of a UV transparent material including one of acryl and quartz.

4. The method of claim 1, wherein the UV transparent mask supporting member further includes a pair of third straight bars, the pair of third straight bars connected with the pair the second straight bars and supporting third and forth side portions of the mask.

5. The method of claim 1, wherein the mask holder further comprise a secondary mask supporting member, the secondary mask supporting member being in the frame.

6. The method of claim 1, wherein the upper part is formed of a UV transparent material including one of acryl and quartz.

* * * * *